(12) United States Patent
Yamashita et al.

(10) Patent No.: US 8,179,678 B2
(45) Date of Patent: May 15, 2012

(54) ELECTRONIC COMPONENT MODULE

(75) Inventors: Mitsuyoshi Yamashita, Osaka (JP); Yoshihisa Amano, Osaka (JP); Akiteru Deguchi, Osaka (JP); Masahiko Kushino, Osaka (JP); Masahiro Murakami, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 140 days.

(21) Appl. No.: 12/753,436

(22) Filed: Apr. 2, 2010

(65) Prior Publication Data

US 2010/0265663 A1 Oct. 21, 2010

(30) Foreign Application Priority Data

Apr. 21, 2009 (JP) ................. 2009-102672

(51) Int. Cl.
*H05K 7/20* (2006.01)
(52) U.S. Cl. ........ 361/715; 361/717; 361/718; 361/818; 257/712; 257/713
(58) Field of Classification Search .................. None
See application file for complete search history.

(56) References Cited

U.S. PATENT DOCUMENTS

| | | | |
|---|---|---|---|
| 6,275,381 B1 * | 8/2001 | Edwards et al. | 361/717 |
| 6,577,504 B1 * | 6/2003 | Lofland et al. | 361/709 |
| 6,707,671 B2 * | 3/2004 | Yamashita et al. | 361/704 |
| 6,744,640 B2 * | 6/2004 | Reis et al. | 361/818 |
| 6,882,536 B2 * | 4/2005 | Deeney et al. | 361/719 |
| 7,193,318 B2 * | 3/2007 | Colgan et al. | 257/713 |
| 7,254,034 B2 * | 8/2007 | Bolle et al. | 361/719 |
| 7,692,927 B2 * | 4/2010 | Jin et al. | 361/704 |
| 7,995,344 B2 * | 8/2011 | Dando et al. | 361/710 |
| 2006/0043562 A1 | 3/2006 | Watanabe | |

FOREIGN PATENT DOCUMENTS

| | | |
|---|---|---|
| JP | 6-177320 A | 6/1994 |
| JP | 7-7197 U | 1/1995 |
| JP | 7-42126 U | 7/1995 |
| JP | 8-306832 A | 11/1996 |
| JP | 2000-117898 A | 4/2000 |
| JP | 2003-78229 A | 3/2003 |
| JP | 2006-73683 A | 3/2006 |
| JP | 2008-235369 A | 10/2008 |

* cited by examiner

*Primary Examiner* — Boris Chervinsky
(74) *Attorney, Agent, or Firm* — Birch, Stewart, Kolasch & Birch, LLP

(57) ABSTRACT

Provided is an electronic component module which has high reliability and is capable of suppressing reduction in handling performance of a mounting machine. An electronic component module includes a plurality of electronic components mounted on a top surface of a module substrate, a planar top plate covering the electronic components, and a top plate holding member for holding the top plate. The plurality of electronic components include a quartz resonator, and a RF-IC which has a height smaller than that of the quartz resonator and is disposed on the top surface of the module substrate so as to be side by side with the quartz resonator. In addition, the top plate is fixed to the quartz resonator, and the top plate holding member for holding the top plate is disposed between the RF-IC and the top plate.

14 Claims, 25 Drawing Sheets

ELECTRONIC COMPONENT MODULE

CROSS-REFERENCE TO RELATED APPLICATIONS

This application is based on Japanese Patent Application No. 2009-102672 filed on Apr. 21, 2009, the contents of which are hereby incorporated by reference.

BACKGROUND OF THE INVENTION

1. Field of the Invention

The present invention relates to an electronic component module.

2. Description of Related Art

In recent years, in the area of electronic equipment such as information communication equipment, demands for reduced size and increased performance of equipment has been growing. Therefore, downsizing, high performance and high density mounting of electronic components housed inside the equipment have been realized. In addition, the electronic components are designed as a module for higher performance and higher density mounting.

An electronic component module containing a plurality of electronic components is mounted on a mounting substrate and housed inside the electronic equipment. In addition, the electronic component module is mounted on the mounting substrate by using a mounting machine, e.g., a mounter in general. In order to improve handling by the mounting machine, there is known a conventional electronic component module having a flat portion for a mounter head to suck and catch. Such an electronic component module is described in Japanese unexamined utility model application publication No. 7-42126.

Japanese unexamined utility model application publication No. 7-42126 describes a composite component (electronic component module) having an insulating plate (top plate) for forming a flat portion on a circuit board. This composite component includes a chip inductor, a chip resistor and an integrated circuit (IC) mounted on the circuit board by surface mounting. In addition, the above-mentioned IC is disposed in the middle region of the circuit board. Further, the above-mentioned insulating plate is fixed onto the top surface of the IC with thermosetting resin. Note that the composite component described in Japanese unexamined utility model application publication No. 7-42126 functions as a filter.

According to the conventional composite component (electronic component module) having the structure described above, the insulating plate is fixed onto the top surface of the IC disposed in the middle region of the circuit board so that the flat portion is formed on the composite component by the insulating plate. Therefore, the flat portion is sucked and caught by the mounter head so that surface mounting can be performed easily by using the mounting machine.

However, the structure of the composite component (electronic component module) described in Japanese unexamined utility model application publication No. 7-42126 has the following disadvantage. If the IC to which the insulating plate is fixed is mounted on an edge portion of the circuit board, the inconvenience occurs that the insulating plate is inclined due to an impact load of the mounter head in a suction catching. Therefore, in this case, there is a problem that handling performance of the mounting machine may be lowered. In addition, there is the inconvenience that a large load is applied to a fixing portion of the insulating plate or a solder bonding portion of the IC due to the inclination of the insulating plate. Thus, the IC is damaged, or electric connection between the IC and the circuit board is broken. Thus, there is a problem that reliability is lowered.

Further, if the IC to which the insulating plate is fixed is mounted on an edge portion of the circuit board in the structure of the composite component (electronic component module) described in the above-mentioned Japanese unexamined utility model application publication No. 7-42126, there is the inconvenience that it becomes difficult to fix the insulating plate for forming the flat portion stably to the circuit board. Therefore, due to this reason too, reliability is decreased, and handling performance of the mounting machine is also lowered.

Particularly in recent years, as electronic component modules have become high performance, the number of electronic components mounted on the electronic component module is apt to increase. Therefore, it is becoming difficult to mount the electronic component such as the IC to which the insulating plate is fixed in the middle region of the circuit board like the above-mentioned conventional composite component. Therefore, as the electronic component module becomes high performance, the above-mentioned problem is apt to occur.

SUMMARY OF THE INVENTION

The present invention is created for solving the above-mentioned problem, and it is an object of the present invention to provide an electronic component module which has high reliability and is capable of suppressing reduction of handling performance of the mounting machine, and to provide a method for manufacturing the electronic component module.

In order to achieve the above-mentioned object, an electronic component module according to an aspect of the present invention includes a first electronic component which is disposed on a top surface of a substrate, a second electronic component which has a height lower than that of the first electronic component and is disposed on the top surface of the substrate so as to be side by side with the first electronic component, a planar top plate which is fixed to the first electronic component so as to cover the first electronic component and the second electronic component, and a top plate holding member which is disposed between the second electronic component and the top plate so as to hold the top plate. Note that each of the first electronic component and the second electronic component contains one or more electronic components. In addition, in the present invention, "to cover the first electronic component and the second electronic component" means the state where at least a part of the first electronic component and at least a part of the second electronic component are disposed on the backside of the top plate in a top view.

In the electronic component module according to this aspect, the planar top plate is fixed to the first electronic component, and the top plate holding member for holding the top plate is disposed between the second electronic component and the top plate as described above. Thus, even if the first electronic component to which the top plate is fixed is mounted on an edge portion of the substrate, the top plate can be fixed in a stable state. Therefore, even if an impact load is applied to the top plate from the mounter head when the suction catching is performed, the top plate holding member can hold the top plate, so that it is possible to suppress inclination of the top plate. Thus, it is possible to suppress reduction of handling performance of the mounting machine.

In addition, in an aspect, the top plate holding member is disposed between the second electronic component and the top plate, so that the impact load of the mounter head is dispersed to at least the first electronic component and the second electronic component so as not to be concentrated only on the first electronic component. Thus, it is possible to suppress a damage to the first electronic component due to the impact load of the mounter head can be suppressed. In addition, since the above-mentioned top plate holding member holds the top plate, it is possible to prevent a large load from being applied to a solder bonding portion or the like of the first electronic component when the mounter head performs the suction catching. Thus, it is possible to suppress occurrence of the inconvenience that the electric connection between the first electronic component and the substrate is broken due to a large load applied to the solder bonding portion of the first electronic component. Therefore, this structure can provide high reliability.

Further, in an aspect, since the top plate holding member disposed between the second electronic component and the top plate can hold the top plate, the top plate can be fixed to the substrate stably. Therefore, it is possible to suppress a variation of the fixing angle of the top plate to the substrate, for example. Therefore, by this structure too, it is possible to suppress a reduction of reliability and to prevent the handling performance of the mounting machine from lowering.

Further, in an aspect, with the structure described above, the top plate can be fixed in a stable state even if the number of mounted electronic components increases as the electronic component module becomes high performance. Therefore, an electronic component module with high reliability and high performance can be obtained.

In the electronic component module according to the above-mentioned aspect, the thickness of the top plate holding member is preferably substantially equal to a difference of height between the first electronic component and the second electronic component. With this structure, the top plate can easily be held to be substantially parallel to the substrate. Therefore, the top plate can be fixed to the substrate easily. Thus, the handling performance of the mounting machine can easily be improved, and reliability can be improved.

In the electronic component module according to the above-mentioned aspect, the second electronic component is preferably a mount component including an integrated circuit element. With this structure, the top plate holding member can be large because the mount component including the integrated circuit element has a top surface of relatively large flat surface area. Therefore, if the top plate holding member disposed between the second electronic component and the top plate is constituted to be large, the top plate can be held more stably. Thus, the top plate can easily be fixed to the substrate in the stable state.

In the electronic component module according to the above-mentioned aspect, the second electronic component can be a high frequency mount component including the integrated circuit element. In this case, it is preferable that the top plate holding member is made of an electromagnetic shield material. With this structure, the top plate holding member for holding the top plate can have a shielding effect. Therefore, even if the top plate itself does not have a shielding effect, it is easy to shield against high frequency noise and the like. Thus, characteristics of the electronic component module can be improved, and reliability can be improved. In addition, if the top plate holding member has the shielding effect, flexibility of selecting a material forming the top plate can also be improved.

In the electronic component module according to the above-mentioned aspect, the second electronic component may be a heat generating component which generates heat by being driven. In this case, it is preferable that the top plate holding member is made of a thermal conductive material. With this structure, heat from the heat generating component can be dissipated through the top plate holding member, so that heat dissipation characteristic of the electronic component module can be improved. Thus, characteristics of the electronic component module can be improved, and reliability can be improved.

In the electronic component module according to the above-mentioned aspect, the top plate holding member is preferably made of a metal material. With this structure, the top plate holding member can easily have a shielding effect. In addition, with this structure, heat from the heat generating component can effectively be dissipated through the top plate holding member.

In the electronic component module according to the above-mentioned aspect, the top plate holding member may be made of a resin material including a thermal conductive resin or an electrically conductive resin. With this structure too, the top plate holding member can have the shielding effect, and heat from the heat generating component can effectively be dissipated through the top plate holding member.

In this case, the resin material forming the top plate holding member preferably contains a thermosetting resin. With this structure, the top plate holding member disposed between the second electronic component and the top plate can easily be formed.

In the electronic component module according to the above-mentioned aspect, the top plate is preferably made of metal plate. With this structure, the top plate covering the first electronic component and the second electronic component can have the shielding effect so that it is easy to shield against high frequency noise and the like. In addition, with this structure, heat from the heat generating component can be dissipated not only through the top plate holding member made of the thermal conductive material but also through the top plate, so that the heat dissipation characteristic of the electronic component module can be improved more. Note that it is also possible to suppress an increase of facility cost and manufacturing cost because the top plate can be formed without using a die in this structure. In other words, if a metal case is attached to the electronic component module for shielding high frequency noise or the like, it is necessary to use a processing die for manufacturing the metal case. Therefore, initial cost for manufacturing the die becomes very high, and there is the inconvenience that the facility cost and the manufacturing cost increase. In contrast, if the top plate is made of metal plate, it is not necessary to use a die for manufacturing the metal case or the like. Thus, an increase of the facility cost can be suppressed so that the manufacturing cost of the electronic component module can be reduced.

In the electronic component module according to the above-mentioned aspect, the top plate may be constituted of a resin insulating plate.

In the electronic component module according to the above-mentioned aspect, the top plate preferably has a composite structure including an insulating base material portion, and an electrically conductive foil formed on the base material portion. With this structure too, the top plate covering the first electronic component and the second electronic component can have the shielding effect so that it is easy to shield against high frequency noise and the like.

In the electronic component module including the top plate having the above-mentioned composite structure, preferably, the base material portion of the top plate is made of a glass epoxy material, and the electrically conductive foil of the top plate is made of copper foil. With this structure, the top plate having the shielding effect can easily be obtained. Note that it is possible to suppress an increase of facility cost and manufacturing cost because the top plate can be formed without using a die in this structure. In other words, if a metal case is attached to the electronic component module for shielding high frequency noise or the like, it is necessary to use a processing die for manufacturing the metal case. In contrast, if the base material portion of the top plate is made of glass epoxy material and the electrically conductive foil formed on the base material portion is made of copper foil, the top plate can be formed by using a manufacturing process of a printed circuit board or the like. Therefore, it is not necessary to use a die for manufacturing the metal case or the like. Thus, an increase of the facility cost can be suppressed so that the manufacturing cost of the electronic component module can be reduced.

In the electronic component module including the top plate having the above-mentioned composite structure, preferably, the electrically conductive foil has a flat surface area smaller than that of the base material portion, and the electrically conductive foil is disposed so that an outer edge of the electrically conductive foil is inside an outer edge of the base material portion in a plan view. With this structure, even if the top plate is detached in the state of being mounted on the printed circuit board (mounting substrate) or the like, it is possible to suppress an occurrence of an electric short circuit or leak with a peripheral component or the like.

In the electronic component module including the top plate having the above-mentioned composite structure, preferably, the top plate further includes an insulating member which covers the electrically conductive foil. With this structure, even if the top plate is detached in the state of being mounted on the printed circuit board (mounting substrate) or the like, it is possible to suppress an occurrence of an electric short circuit or leak with a peripheral component or the like.

In this case, the insulating member may have an opening portion which exposes a part of the electrically conductive foil. With this structure, a ground shielding effect can easily be obtained by electrically connecting a part of the electrically conductive foil exposed at the opening portion with a ground portion of the electronic equipment on which the electronic component module is mounted, for example.

In addition, in this case, the top plate may be adapted so that the opening portion is disposed on the opposite side to the substrate. With this structure, a part of the electrically conductive foil can easily be connected electrically with the ground portion of the electronic equipment on which the electronic component module is mounted.

The electronic component module according to the above-mentioned aspect, preferably, further includes an elastic member having an elastic function disposed between the top plate and the electronic component, and the top plate is fixed to the first electronic component via the elastic member. With this structure, an impact received from the mounter head when the electronic component module is mounted on the printed circuit board or the like can be absorbed by the elastic member. Therefore, the impact load applied to the electronic component (the first electronic component and the second electronic component) can be reduced so that withstand load performance can be improved. Thus, it is possible to prevent the mounted electronic components (the first electronic component and the second electronic component) from being damaged, and it is possible to suppress a break of the electric connection between the electronic components (the first electronic component and the second electronic component). As a result, with this structure too, reliability can be improved.

In this case, the elastic member may be formed in a sheet-like shape having a predetermined thickness. In addition, it is possible to fix such the elastic member to the top plate in advance.

In the structure of the electronic component module having the above-mentioned elastic member, it is preferable that the elastic member is made of an epoxy resin having low elasticity. If the top plate is fixed via such the elastic member, an impact received from the mounter head when being mounted on the printed circuit board or the like can easily be absorbed by the elastic member. Thus, the impact load applied to the electronic components (the first electronic component and the second electronic component) can easily be reduced.

In the electronic component module according to the above-mentioned aspect, preferably, the top plate has a flat surface area smaller than that of the substrate, and the top plate is disposed so that an outer edge of the top plate is inside an outer edge of the substrate. With this structure, even if a strong impact is applied laterally to the electronic component module due to dropping in a module installing step or a swing abut caused by vibration during transportation of the product (electronic component module) in a wrapped state in a tray, for example, it is possible to prevent such the impact from being applied directly to the top plate. Thus, it is possible to suppress occurrence of the inconvenience such as a damage to the electronic component or a break in electric connection between the electronic component and the substrate due to a direct lateral strong impact to the top plate. Thus, reliability can be improved more.

As described above, according to the present invention, it is possible to obtain easily the electronic component module which has high reliability and is capable of suppressing reduction in handling performance of the mounting machine.

DETAILED DESCRIPTION OF THE INVENTION

Hereinafter, concrete embodiments of the present invention will be described in detail with reference to the attached drawings.

(First Embodiment)

Figure 1:
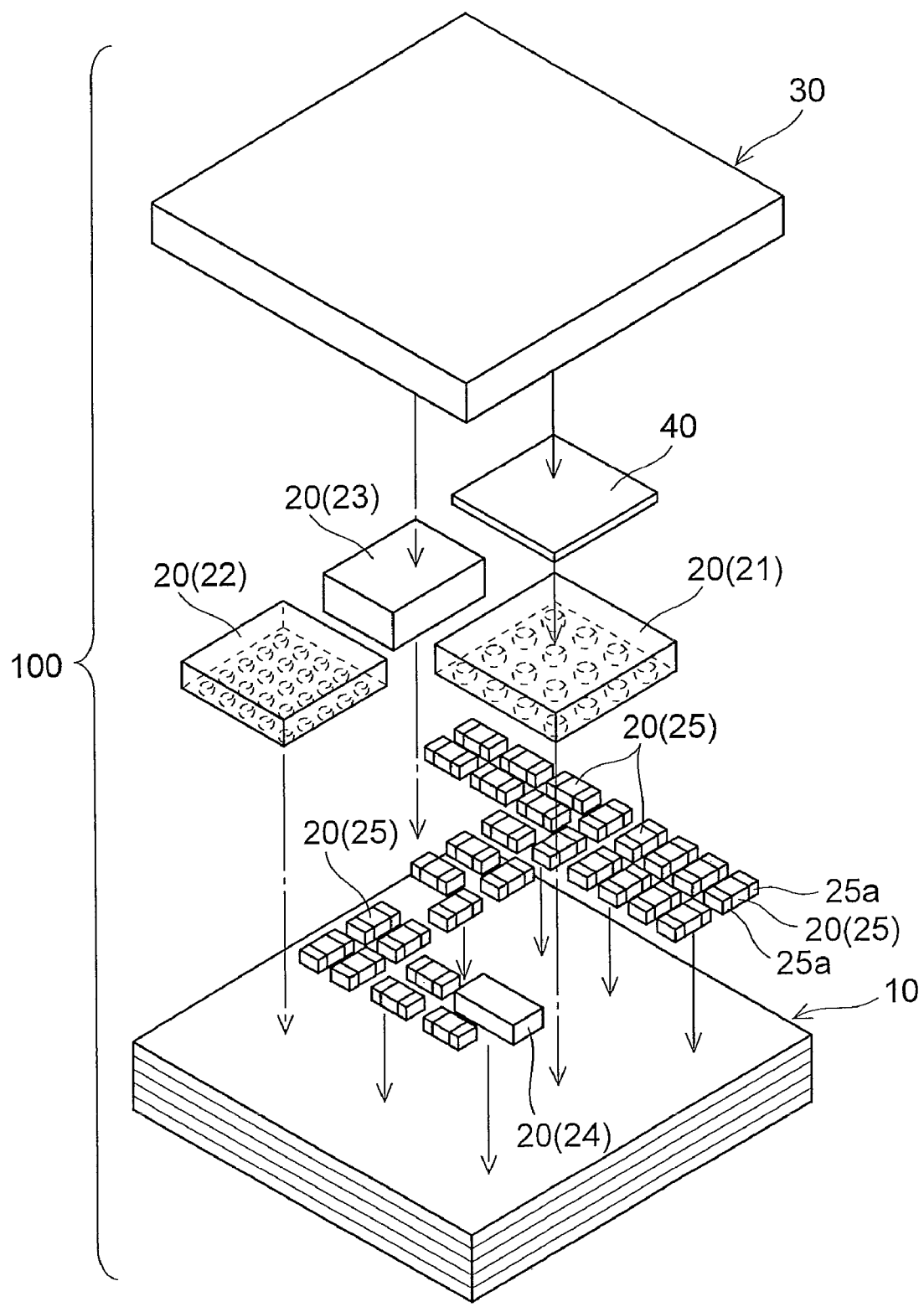
FIG. 1 is an exploded perspective view of an electronic component module according to a first embodiment of the present invention.
Figure 2:
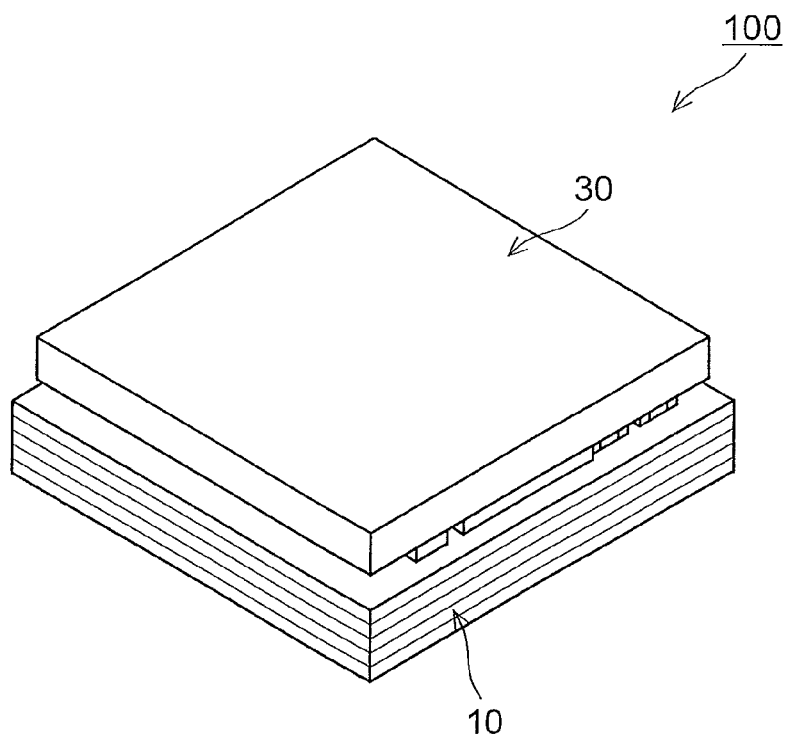
FIG. 2 is a general perspective view of the electronic component module according to the first embodiment of the present invention.
Figure 3:
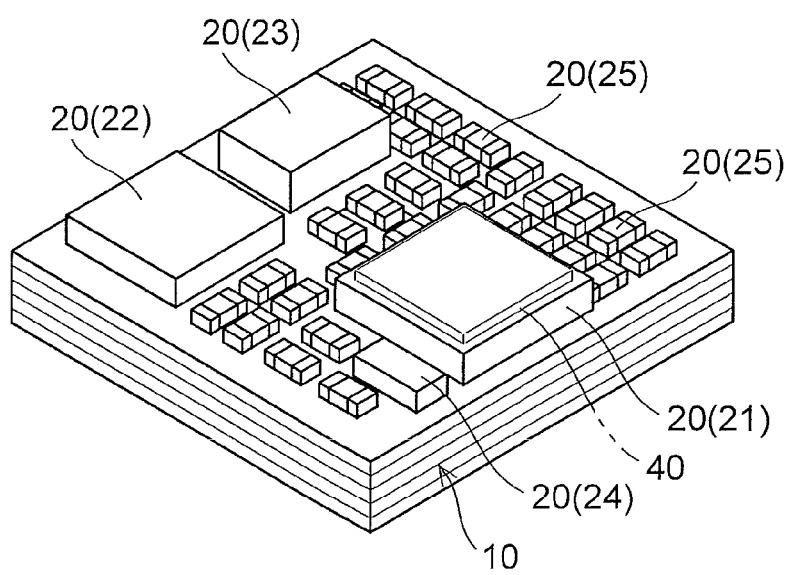
FIG. 3 is a perspective view of the electronic component module according to the first embodiment of the present invention.
Figure 4:
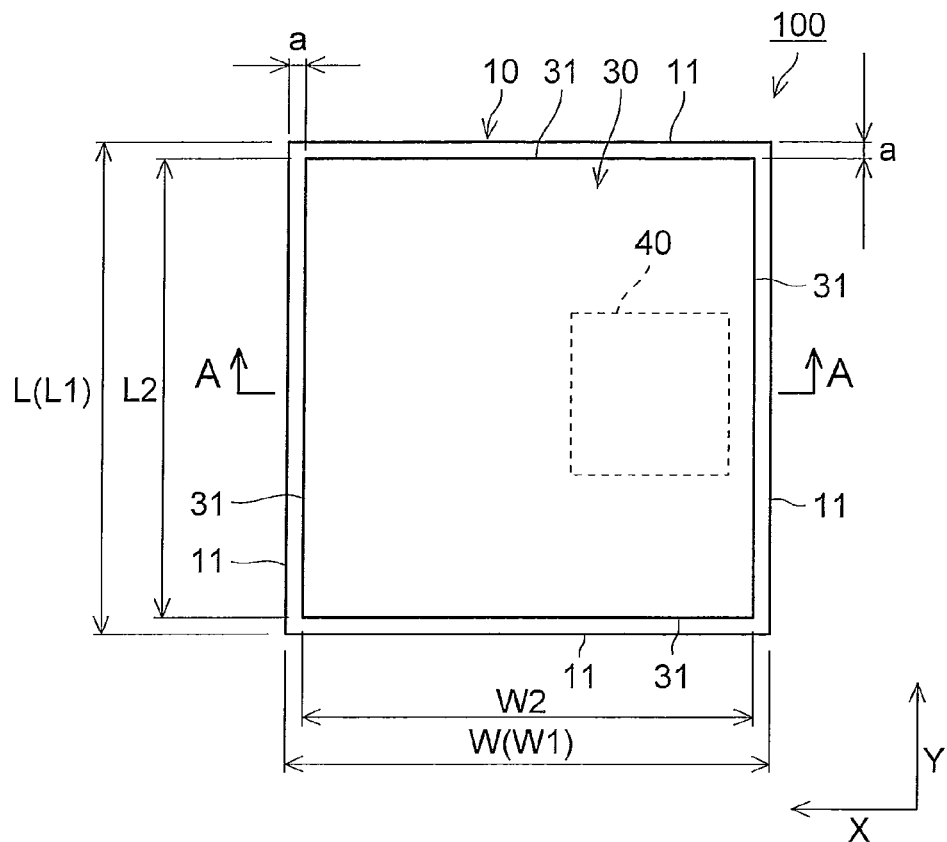
FIG. 4 is a plan view of the electronic component module according to the first embodiment of the present invention.
Figure 5:
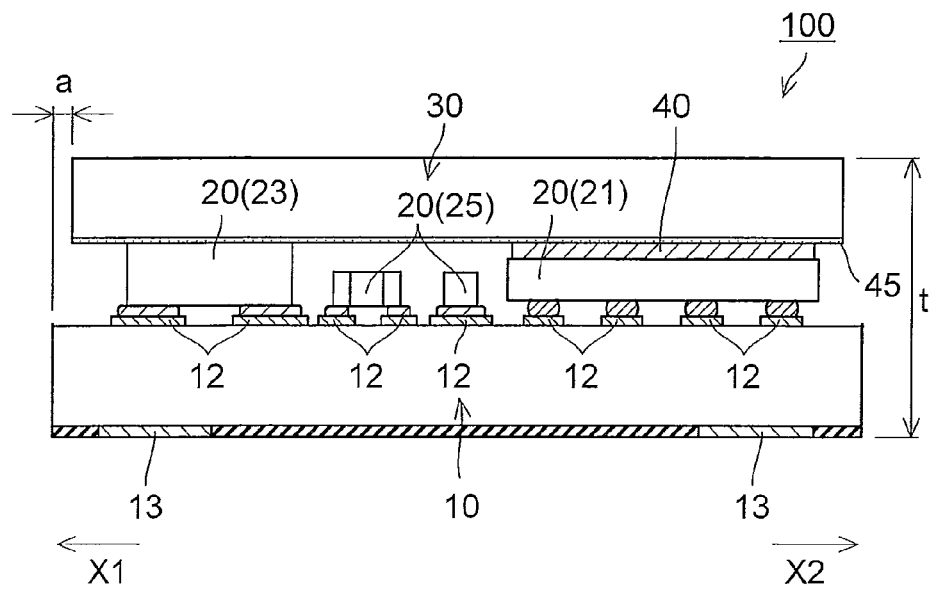
FIG. 5 is a cross sectional view of the electronic component module according to the first embodiment of the present invention.
Figure 6:
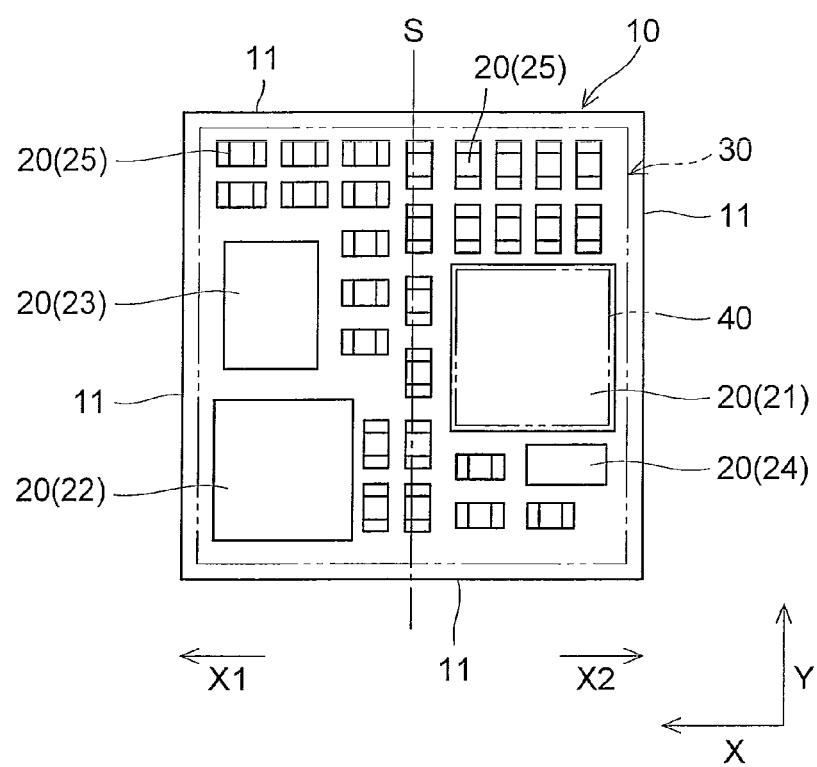
FIG. 6 is a plan view of the electronic component module according to the first embodiment of the present invention (in the state where a top plate is removed).

FIG. 1 is an exploded perspective view of an electronic component module according to a first embodiment of the present invention, and FIG. 2 is a general perspective view of the electronic component module according to the first embodiment of the present invention. FIG. 3 is a perspective view of the electronic component module according to the first embodiment of the present invention, and FIG. 4 is a plan view of the electronic component module according to the first embodiment of the present invention. FIGS. 5 to 10 are diagrams for illustrating a structure of the electronic component module according to the first embodiment of the present invention. Note that FIGS. 3 and 6 illustrate a state where a top plate is removed, and FIG. 5 illustrates a cross section cut along the line A-A in FIG. 4. First, with reference to FIGS. 1 to 10, the structure of an electronic component module 100 according to the first embodiment of the present invention will be described.

The electronic component module 100 according to the first embodiment is constituted to function as a tuner module (high frequency module) and includes, as illustrated in FIGS. 1 to 3, a module substrate 10, a plurality of electronic components 20 mounted on the top surface of the module substrate 10, a planar top plate 30 which covers the electronic components 20, and a top plate holding member 40 which holds the top plate 30. Note that the module substrate 10 is an example of the "substrate" of the present invention.

In addition, the electronic component module 100 according to the first embodiment has a square shape in a plan view as illustrated in FIG. 4. Specifically, the electronic component module 100 has a width W of approximately 5.9 mm in X direction and a length L of approximately 5.9 mm in Y direction. In addition, as illustrated in FIG. 5, the electronic component module 100 has a thickness t of approximately 1.0 mm.

The module substrate 10 of the electronic component module 100 is constituted of a ceramic multilayer substrate having a predetermined thickness. This module substrate 10 is formed in a square shape having four sides (outer edges) 11 in a plan view as illustrated in FIGS. 4 and 6. Specifically, the module substrate 10 is formed to have a width W1 (see FIG. 4) of approximately 5.9 mm in X direction and a length L1 (see FIG. 4) of approximately 5.9 mm in Y direction. In addition, as illustrated in FIG. 5, the module substrate 10 is provided with wiring conductors 12 formed in a predetermined wiring pattern, to which the electronic components 20 are electrically connected. On the other hand, the underside of the module substrate 10 is provided with electrode terminals 13 which are electrically connected to the wiring conductors 12 via through holes (not shown) or via holes (not shown).

The plurality of electronic components 20 mounted on the top surface of the module substrate 10 include an active component such as a semiconductor device (IC) and a passive component such as a resistor element, an inductor element, a capacitor element, or the like. Specifically, the plurality of electronic components 20 include a radio frequency integrated circuit (RF-IC) 21, an orthogonal frequency division multiplexing (OFDM) demodulation IC 22, a quartz resonator 23, a band pass filter 24 and passive components 25 (a resistor element, a capacitor element, an inductor element, and the like). In other words, the electronic component module 100 according to the first embodiment includes all principle electronic components for functioning as a tuner. Then, these electronic components 20 are mounted on the top surface of the module substrate 10 in a predetermined region by surface mounting (solder bonding) and are electrically connected with each other via the wiring conductors 12 (see FIG. 5) and the via holes (not shown) of the module substrate 10. Thus, a kind of integrated circuit is constituted, and the electronic component module 100 is constituted to function as a tuner module (high frequency module). Note that the quartz resonator 23 is an example of the "first electronic component" in the present invention, the RF-IC 21 is an example of the "second electronic component", the "mount component including the integrated circuit element" and the "high frequency mount component including the integrated circuit element" of the present invention.

In addition, the quartz resonator 23 has a length dimension of 1.6 mm and a width dimension of 1.2 mm. The setting height thereof after mounting is approximately 0.35 mm to 0.45 mm. In addition, the RF-IC 21 has a length dimension of 2.1 mm and a width dimension of 2.1 mm. This RF-IC 21 is mounted on the top surface of the module substrate 10 together with the quartz resonator 23 side by side and has a height (setting height after mounting) lower than that of the quartz resonator 23. Specifically, the RF-IC 21 has a height (setting height after mounting) of approximately 0.2 to 0.3 mm. In addition, the OFDM demodulation IC 22 has a length dimension of 2.9 mm and a width dimension of 2.7 mm, and the setting height after mounting is approximately 0.2 to 0.3 mm. Note that each of the RF-IC 21 and the OFDM demodulation IC 22 is constituted as a wafer level chip scale package (WL-CSP) in the first embodiment. In addition, the quartz resonator 23 is a tall component having a largest height in the first embodiment.

In addition, the passive component 25 is constituted of a chip type electronic component (chip component). This passive component 25 has a ceramic sintered body as an element and external terminal electrodes 25a on both edge portions of the same (see FIG. 1). Dimensions of the passive component 25 are as follows. In the case of a so-called 0603 component, for example, the length dimension is 0.6 mm, the width dimension is 0.3 mm, and the height is 0.3 mm. In the case of a so-called 0402 component, the length dimension is 0.4 mm, the width dimension is 0.4 mm, and the height is 0.2 mm.

In addition, in the first embodiment, as illustrated in FIG. 6, the quartz resonator 23 that is a tall component is mounted in the region of one edge portion side (X1 side) with respect to the center S in X direction of the module substrate 10. On the other hand, the RF-IC 21 is mounted in the region of the other edge portion side (X2 side) with respect to the center S in X direction of the module substrate 10. Note that both the quartz resonator 23 and the RF-IC 21 are mounted in the center region in Y direction of the module substrate 10.

In addition, as illustrated in FIGS. 1, 2 and 5, the top plate 30 is disposed on the top surface side of the module substrate 10 so as to cover the electronic component 20. This top plate 30 is constituted of a resin insulating plate and has a thickness of approximately 0.1 to 0.3 mm. Note that the top plate 30 has predetermined flexibility under an operation condition of the electronic component module 100. In addition, the top plate 30 is formed in a square shape having four sides (outer edges) 31 in a plan view as illustrated in FIG. 4. Specifically, the top plate 30 has a width W2 of approximately 5.6 mm in X direction and a length L2 of approximately 5.6 mm in Y direction. In other words, in the first embodiment, the top plate 30 is formed to have a flat surface area smaller than that of the module substrate 10.

In addition, as illustrated in FIG. 5, an adhesive layer 45 formed on the back surface (surface opposed to the module substrate 10) of the top plate 30. The top plate 30 is fixed to the top surface of the quartz resonator 23 via the adhesive layer 45.

In addition, the top plate 30 is disposed at the middle portion of the module substrate 10 so that the sides (outer edges) 31 of the top plate 30 are positioned inside the sides (outer edges) 11 of the module substrate 10 in a plan view as illustrated in FIG. 4. Specifically, the top plate 30 is disposed so that the sides (outer edges) 31 of the top plate 30 are positioned inside the sides (outer edges) 11 of the module substrate 10 by a distance "a" of approximately 0.15 mm (see FIGS. 2 and 4).

Here, in the first embodiment, as illustrated in FIG. 5, the top plate holding member 40 is disposed between the RF-IC 21 and the top plate 30 fixed to the quartz resonator 23. This top plate holding member 40 has a thickness (approximately 0.05 to 0.25 mm) that is substantially the same as a height difference between the quartz resonator 23 and the RF-IC 21 so as to compensate for the gap between the top plate 30 and the RF-IC 21. Then, with this top plate holding member 40, the top plate 30 is kept so as to parallel substantially to the module substrate 10. In other words, with the top plate holding member 40, the top plate 30 is fixed to the module substrate 10 in a stable state.

In addition, in the first embodiment, the top plate holding member 40 is made of a shield material (electromagnetic shield material). Specifically, the top plate holding member 40 is made of metal plate made of copper, aluminum or the like. In addition, the top plate holding member 40 has, for example, a length dimension of 2.0 mm and a width dimension of 2.0 mm, and is disposed so as to cover the top surface of the RF-IC 21. Note that the surface of the top plate holding member 40 facing the RF-IC 21 is provided with an adhesive layer (not shown). Therefore, the top plate holding member 40 is fixed to the top surface of the RF-IC 21. In addition, the top plate holding member 40 is also fixed to the top plate 30 via the adhesive layer 45.

Figure 7:
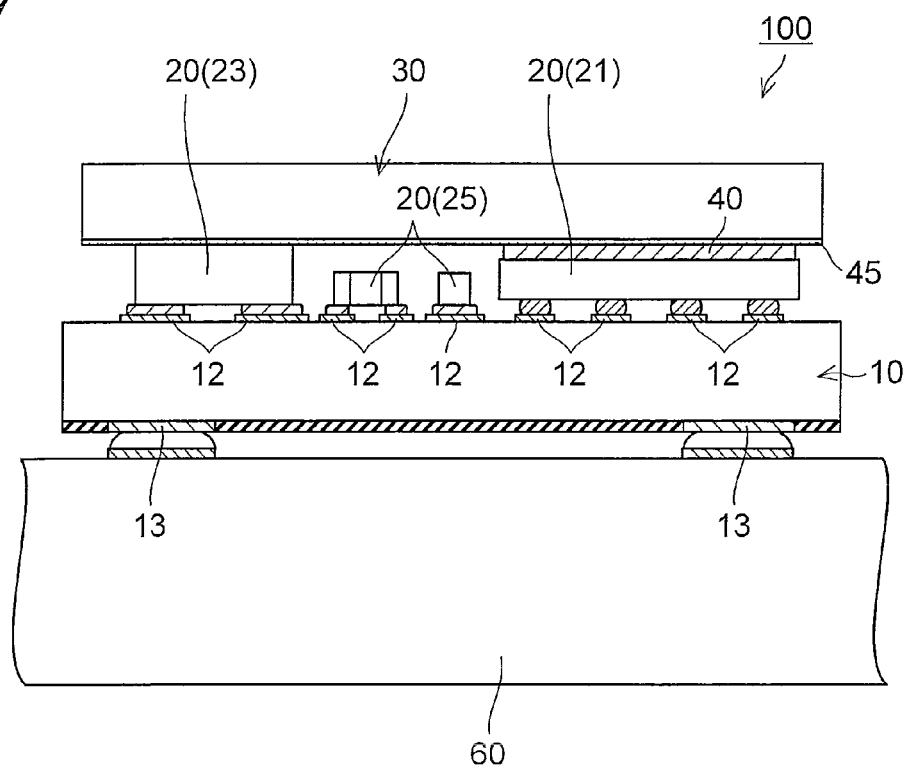
FIG. 7 is a diagram illustrating a state where the electronic component module according to the first embodiment is mounted on the mounting substrate.
Figure 8:
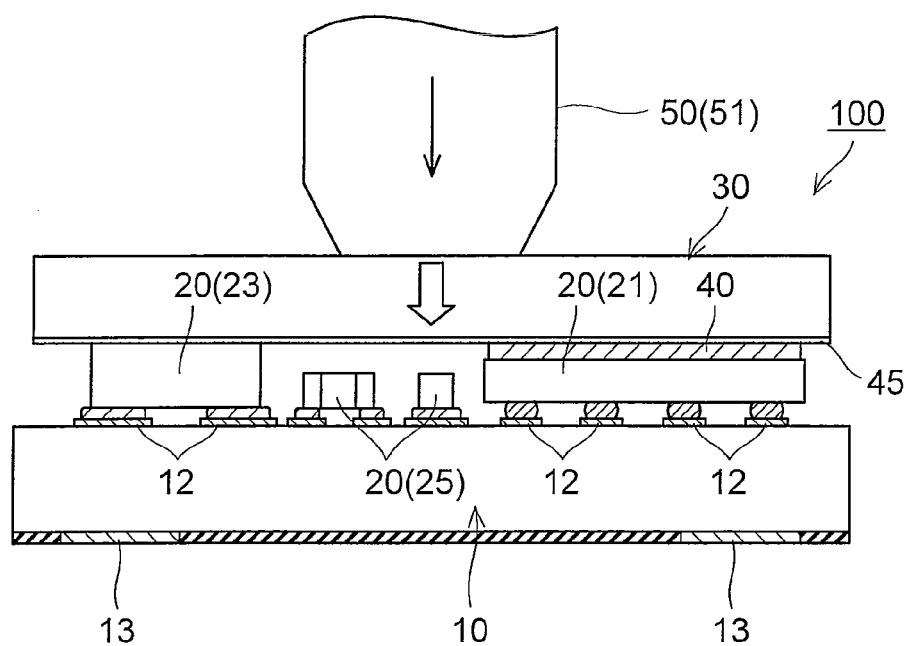
FIG. 8 is a diagram for illustrating a state where the electronic component module according to the first embodiment is sucked and caught.

The electronic component module 100 according to the first embodiment having the above-mentioned structure is moved by a mounter 50 (see FIG. 8) to a mounting position on a mounting substrate 60 (printed circuit board) and is mounted on the mounting substrate 60 as illustrated in FIGS. 7 and 8.

Figure 9:
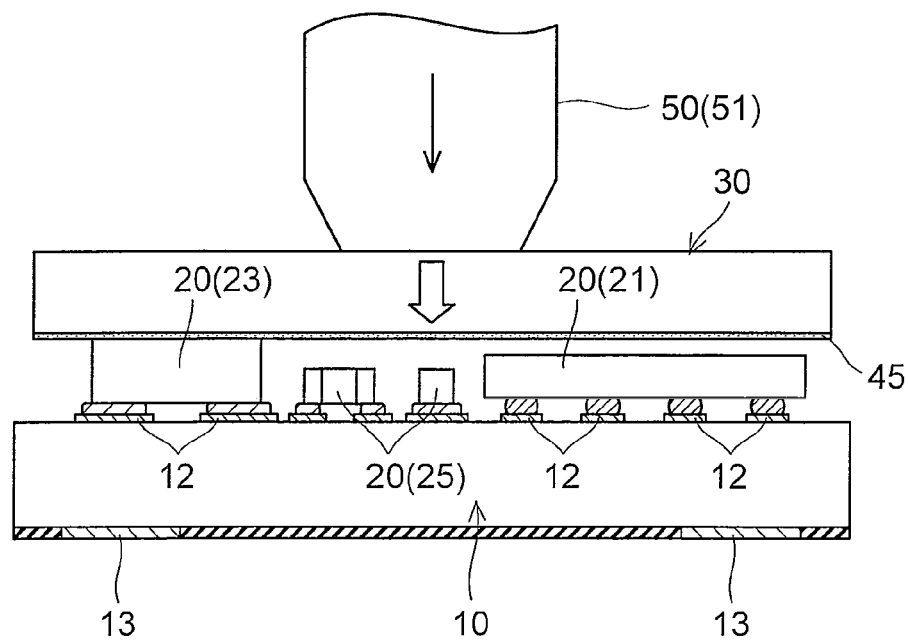
FIG. 9 is a diagram for illustrating a state where the electronic component module without the top plate holding member is sucked and caught.
Figure 10:
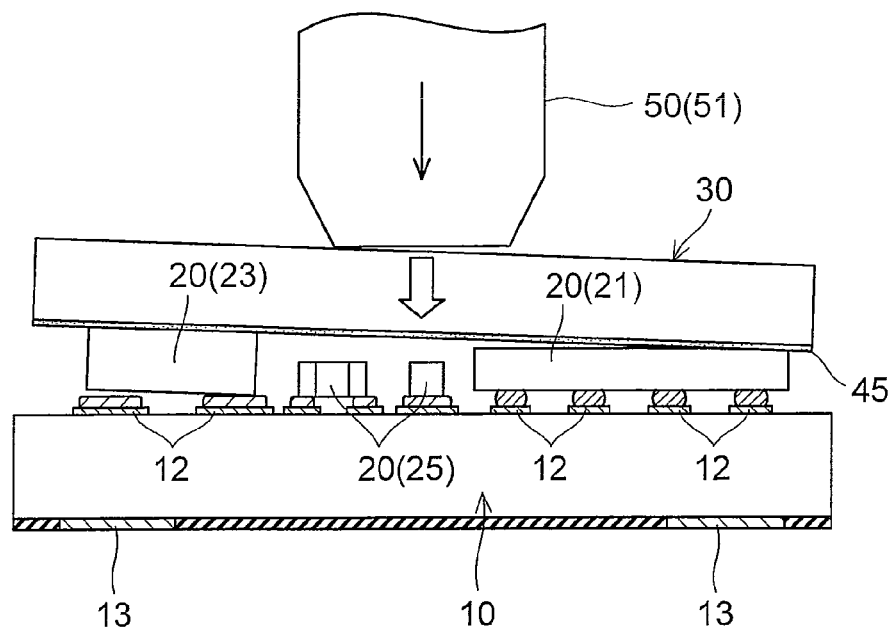
FIG. 10 is a diagram for illustrating a state where the electronic component module without the top plate holding member is sucked and caught.

Here, as illustrated in FIG. 9, if the top plate holding member is not disposed between the quartz resonator 23 and the RF-IC 21, a gap is formed between the top plate 30 and the RF-IC 21 due to the height difference between quartz resonator 23 and the RF-IC 21. In such the state, if a mounter head 51 performs the suction catching, an impact load from the mounter head 51 causes a large load on a solder bonding portion or the like of the quartz resonator 23. As a result, as illustrated in FIG. 10, the inconvenience that the electric connection between the quartz resonator 23 and the module substrate 10 is broken occurs. In addition, if the impact load from the mounter head 51 is applied to the top plate 30, the top plate 30 is inclined so that the suction operation by the mounter 50 becomes difficult. Therefore, the inconvenience that handling property by the mounter 50 is lowered also occurs.

Note that a plurality of semiconductor devices (IC) are mounted for high performance of the electronic component module recent years. Therefore, unlike the conventional composite component working as a filter, it is becoming difficult to mount the electronic component to which the top plate is fixed in the center region on the module substrate. In addition, the number of external components such as passive components is also larger than that of the conventional composite component working as a filter. Therefore, the area of the portion on the top plate that does not contact with the electronic component (floating portion) is increasing. Thus, the above-mentioned inconvenience is apt to occur.

In contrast, in the electronic component module 100 according to the first embodiment, the top plate 30 is held by the top plate holding member 40 as illustrated in FIG. 8. Therefore, even if an impact load from the mounter head 51 is applied to the top plate 30, the inclination of the top plate 30 is suppressed. In addition, since the top plate 30 is held by the top plate holding member 40 in the first embodiment, an application of a large load from the mounter head 51 to the solder bonding portion or the like of the quartz resonator 23 is suppressed when the suction catching is performed.

In the first embodiment, as described above, the planar top plate 30 is fixed to the quartz resonator 23, and the top plate holding member 40 for holding the top plate 30 is disposed between the RF-IC 21 and the top plate 30. Thus, even if the quartz resonator 23 to which the top plate 30 is fixed is mounted at an edge portion on the module substrate 10, the top plate 30 can be fixed in a stable state. Therefore, even if an impact load from the mounter head 51 is applied to the top plate 30 in the suction catching operation, the top plate 30 can be held by the top plate holding member 40, so that inclination of the top plate 30 can be suppressed. Thus, it is possible to suppress the handling property by the mounter (mounting machine) 50 from being lowered.

In addition, in the first embodiment, the top plate holding member 40 is disposed between the RF-IC 21 and the top plate 30, the impact load from the mounter head 51 in the suction catching operation can be dispersed to the quartz resonator 23 and the RF-IC 21. Therefore, it is possible to suppress the impact load of the mounter head 51 from being applied only to the quartz resonator 23. Thus, a damage to the quartz resonator 23 due to the impact load from the mounter head 51 can be suppressed. In addition, since the top plate holding member 40 holds the top plate 30, it is possible to suppress the large load from being applied to the solder bonding portion or the like of the quartz resonator 23 when the suction catching is performed by the mounter head 51. Thus, it is possible to suppress the occurrence of the inconvenience that the electric connection between the quartz resonator 23 and the module substrate 10 is broken due to application of the large load to the solder bonding portion or the like of the quartz resonator 23. Therefore, with this structure, high reliability can be obtained.

In addition, in the first embodiment, since the top plate holding member 40 disposed between the RF-IC 21 and the top plate 30 can hold the top plate 30, the top plate 30 can be fixed stably to the module substrate 10. Therefore, a variation of the fixing angle of the top plate 30 with respect to the module substrate 10 can be suppressed. Therefore, also by this structure, lowering of the reliability can be suppressed, and handling property by the mounter 50 can be prevented from being lowered.

Further, in the first embodiment with the above-mentioned structure, even if the number of mounted electronic components increases as the electronic component module becomes high performance, the top plate can be fixed in a stable state. Therefore, the electronic component module with high reliability and high performance can be provided.

In addition, in the first embodiment, the thickness of the top plate holding member 40 is substantially the same as a height difference between the quartz resonator 23 and the RF-IC 21, the top plate 30 can easily be held to be substantially parallel to the module substrate 10. Therefore, the top plate 30 can be easily fixed to the module substrate 10 in a stable state. Thus, handling property by the mounter 50 and reliability can easily be improved.

In addition, the top plate holding member 40 is disposed on the top surface of the RF-IC 21 in the first embodiment, so that the RF-IC 21 has a relatively large flat surface area of the top surface compared with other electronic components such as the passive component 25. Therefore, the top plate holding member 40 can be formed to have a large size. Therefore, the top plate 30 can be held more stably by forming the top plate holding member 40 disposed between the RF-IC 21 and the top plate 30 in a large size. Thus, the top plate 30 can easily be fixed to the module substrate 10 in a more stable state.

In addition, in the first embodiment, since the top plate holding member 40 is made of metal plate, the top plate holding member 40 for holding the top plate 30 can have a shielding effect. Therefore, if the top plate holding member 40 is disposed so as to cover the top surface of the RF-IC 21, it is easy to shield against high frequency noise and the like even if the top plate itself does not have a shielding effect. Thus, characteristics of the electronic component module 100 can be improved, and reliability can be improved. In addition, since the top plate holding member 40 has a shielding effect, flexibility in selecting the material of the top plate 30 can be enhanced. Note that the top plate holding member 40 is formed separately from the top plate 30, so it can be made of a material different from that of the top plate 30. Therefore, flexibility in selecting the material of the top plate holding member 40 can also be enhanced.

In addition, in the first embodiment, the top plate 30 is constituted of a resin insulating plate. Therefore, even if the top plate 30 is detached in the state of being mounted on the mounting substrate 60 (printed circuit board) or the like, occurrence of an electric short circuit with a peripheral component or a leak can be suppressed.

In addition, in the first embodiment, if the top plate 30 has a flexibility, even if an impact load from the mounter head 51 is applied to the top plate 30, the top plate 30 can be bent so that the impact load applied to the electronic component module 100 can effectively be reduced. Thus, withstand load performance of the electronic component module 100 can be improved. In addition, if the impact load applied to the electronic component module 100 is reduced, damages to the quartz resonator 23 and the RF-IC 21 can effectively be suppressed.

In addition, in the first embodiment, the top plate 30 is formed to have a flat surface area smaller than that of the module substrate 10 and the top plate 30 is disposed so that sides (outer edges) 34 of the top plate 30 are inside the sides (outer edges) 11 of the module substrate 10 in a plan view. Thus, for example, even if a large impact is applied laterally to the electronic component module 100 due to dropping in the module installing step or a swing abut caused by vibration during transportation of the product in a wrapped state in a tray, it is possible to prevent such impact from being applied directly to the top plate 30. Thus, it is possible to suppress occurrence of the inconvenience such as a damage to the mounted electronic component 20 or a break in electric connection between the electronic component 20 and the module substrate 10 due to a direct lateral strong impact to the top plate 30. Therefore, reliability of the electronic component module 100 can be improved by this too.

FIGS. 11 to 18 are diagrams for illustrating a manufacturing method of the electronic component module according to the first embodiment of the present invention. Next, with reference to FIGS. 1, 4, 5 and 11 to 18, a manufacturing method of the electronic component module 100 according to the first embodiment of the present invention will be described.

Figure 11:
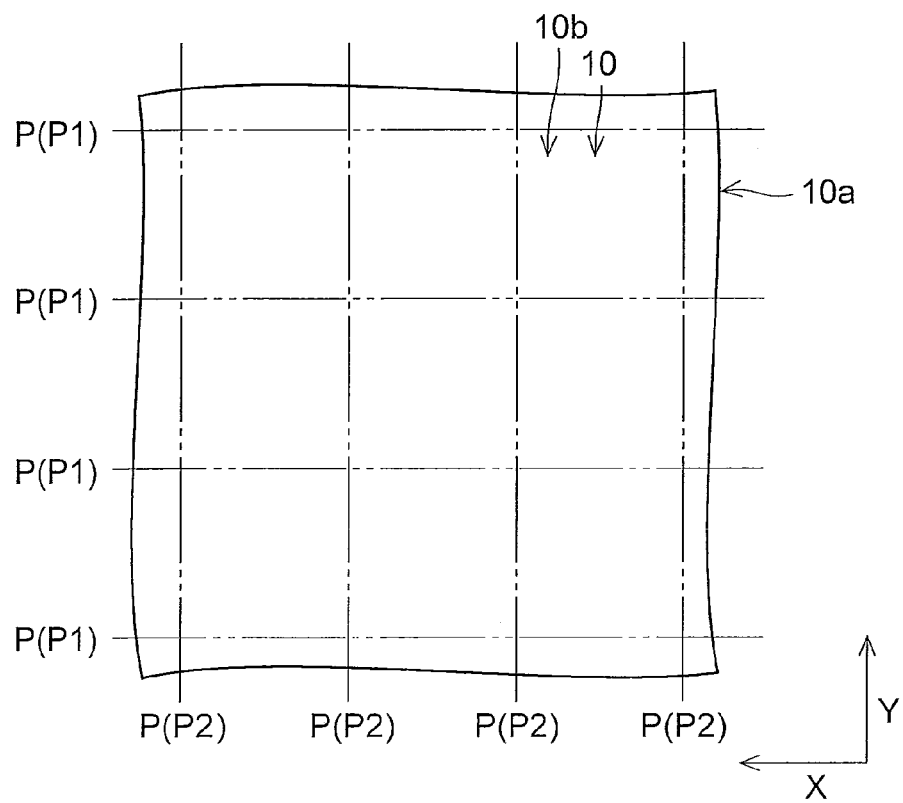
FIG. 11 is a plan view for illustrating a manufacturing method of the electronic component module according to the first embodiment of the present invention.

First, as illustrated in FIG. 11, a substrate aggregate 10a in which a plurality of module substrates 10 are coupled is prepared. This substrate aggregate 10a is constituted of a ceramic multilayer substrate, and a top surface of the substrate aggregate 10a is provided with a component mounting region 10b in which the electronic components 20 are mounted (see FIG. 1). Note that substrate aggregate 10a is split into individual module substrates 10 in the later step, in which it is cut along a dicing line P (P1) in X direction and a dicing line P (P2) in Y direction. In addition, the above-mentioned component mounting region 10b is disposed in each of the module substrates 10.

Figure 12:
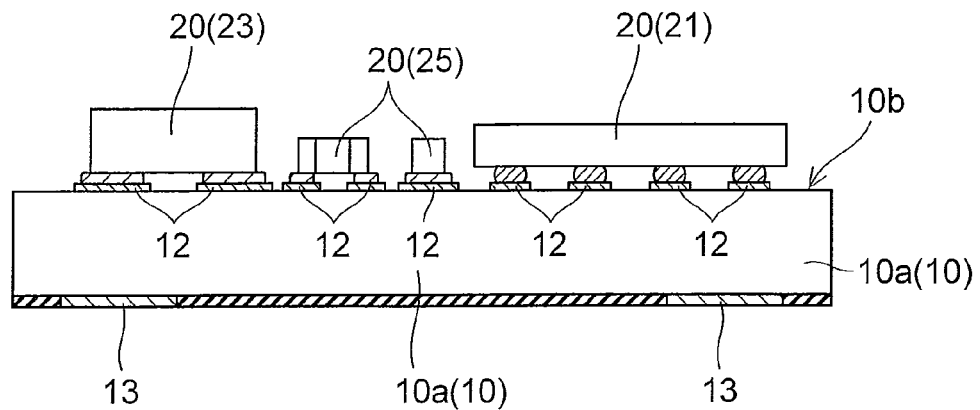
FIG. 12 is a cross sectional view for illustrating the manufacturing method of the electronic component module according to the first embodiment of the present invention.
Figure 13:
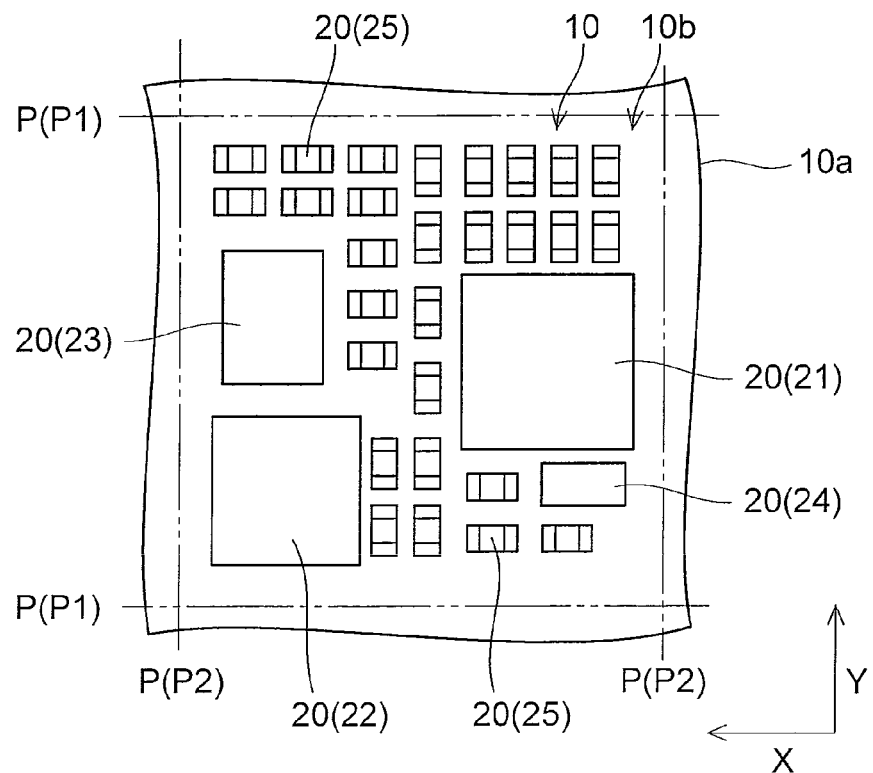
FIG. 13 is a plan view for illustrating the manufacturing method of the electronic component module according to the first embodiment of the present invention.
Figure 14:
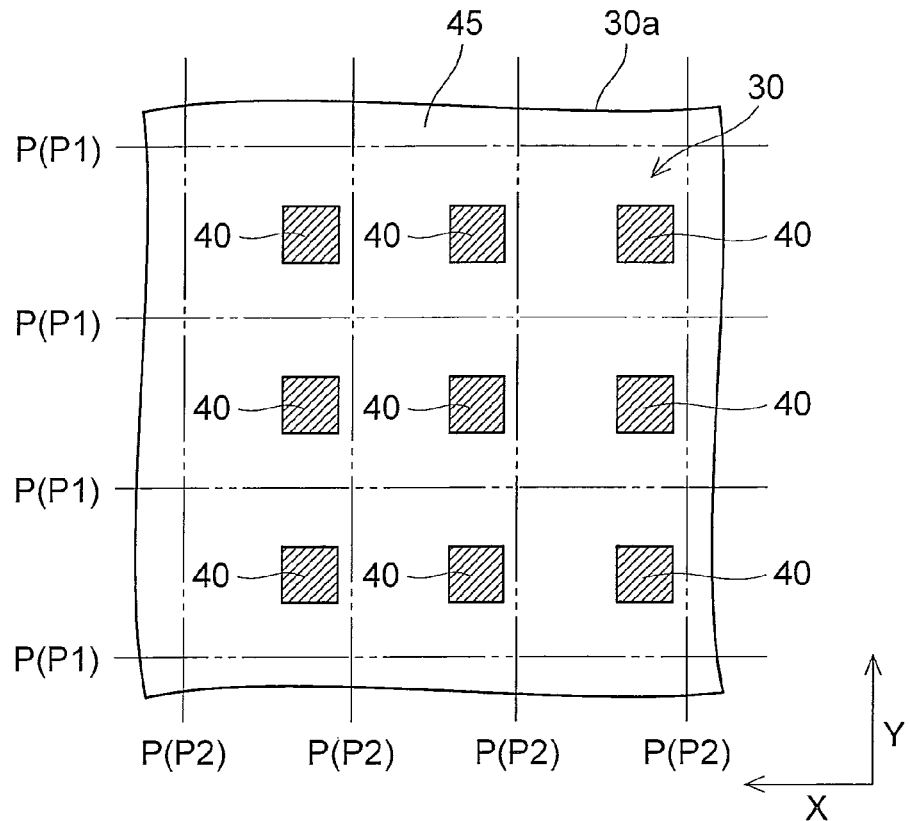
FIG. 14 is a plan view for illustrating the manufacturing method of the electronic component module according to the first embodiment of the present invention.

Next, as illustrated in FIGS. 12 and 13, the electronic components 20 are mounted in the component mounting region 10b of the substrate aggregate 10a (module substrates 10). Next, as illustrated in FIG. 14, a top plate aggregate 30a constituted of a planar insulating plate is prepared. This top plate aggregate 30a is in the state where the plurality of top plates 30 are coupled. In the later step, the top plate aggregate 30a is split into individual top plates 30 by being cut along the dicing line P (P1) in X direction and the dicing line P (P2) in Y direction.

Next, the adhesive layer 45 (see FIG. 5) is formed on one surface of the top plate aggregate 30a. Next, metal plate having a thickness (approximately 0.05 to 0.25 mm) which is substantially equal to the height difference between the quartz resonator 23 and the RF-IC 21 is processed so as to form a plurality of top plates holding members 40 having a length dimension of 2.0 mm and a width dimension of 2.0 mm. Then, the formed top plate holding member 40 is fixed to the surface of the top plate aggregate 30a on which the adhesive layer 45 is formed. In this case, the top plate holding member 40 is fixed to the region corresponding to the RF-IC 21 mounted on the substrate aggregate 10a. In addition, the adhesive layer (not shown) is formed on both surfaces of the top plate holding member 40 or one surface (the surface opposite to the top plate aggregate 30a).

Figure 15:
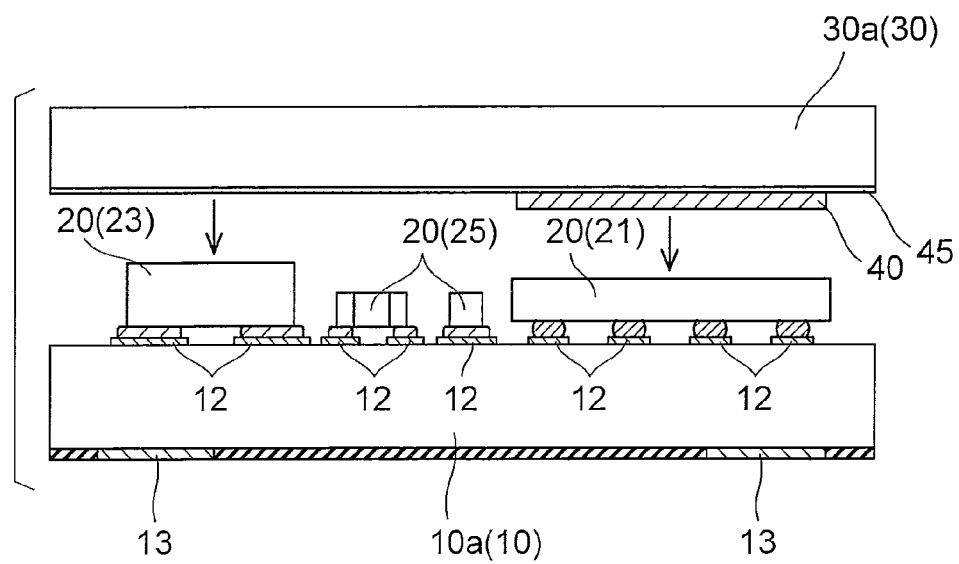
FIG. 15 is a cross sectional view for illustrating the manufacturing method of the electronic component module according to the first embodiment of the present invention.

After that, as illustrated in FIG. 15, the top plate aggregate 30a with the top plate holding member 40 is fixed to a part of the electronic component 20 mounted on the component mounting region 10b of the substrate aggregate 10a. Specifically, the top plate aggregate 30a is fixed to the top surface of the quartz resonator 23 that is a tall component via the adhesive layer 45, and the top plate holding member 40 is fixed to the top surface of the RF-IC 21. Thus, as illustrated in FIG. 16, the top plate aggregate 30a is attached to the substrate aggregate 10a (see FIGS. 11 and 15).

Figure 16:
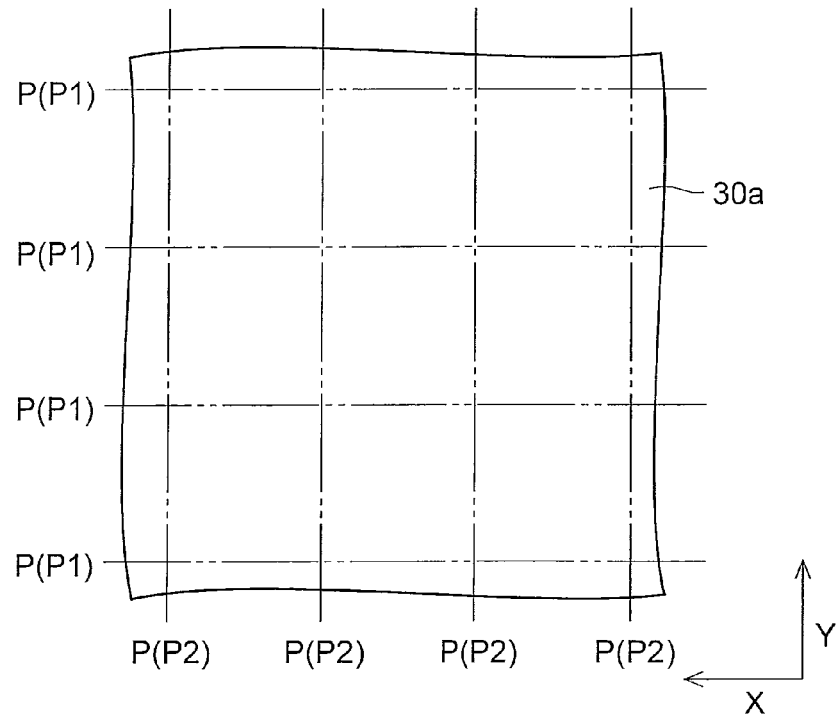
FIG. 16 is a plan view for illustrating the manufacturing method of the electronic component module according to the first embodiment of the present invention.

Finally, the individual electronic component modules are obtained by cutting (dicing) along the dicing line P (P1 and P2) as illustrated in FIG. 16.

Figure 17:
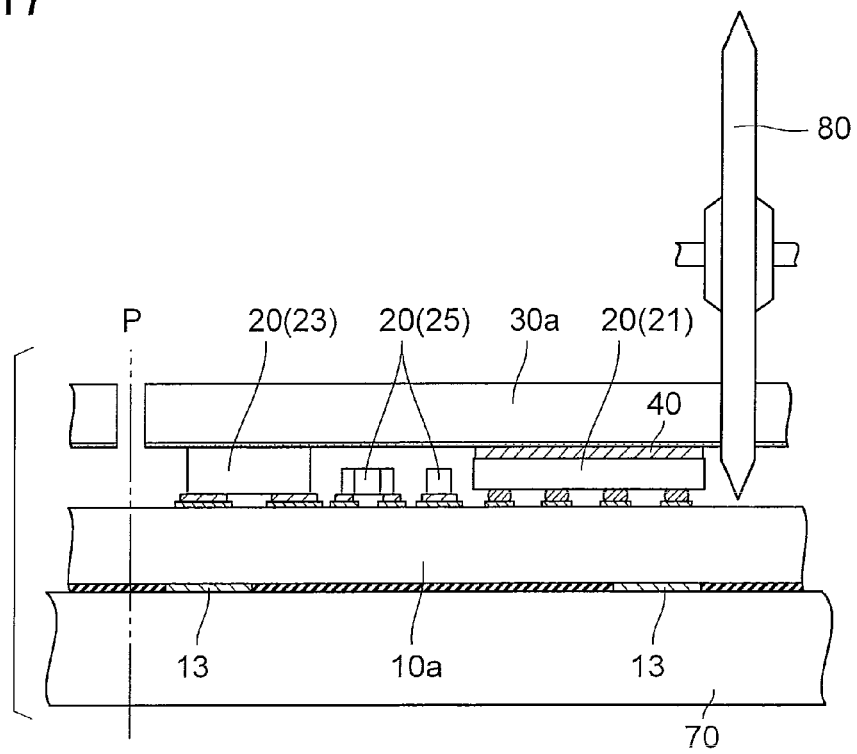
FIG. 17 is a cross sectional view for illustrating the manufacturing method of the electronic component module according to the first embodiment of the present invention.
Figure 18:
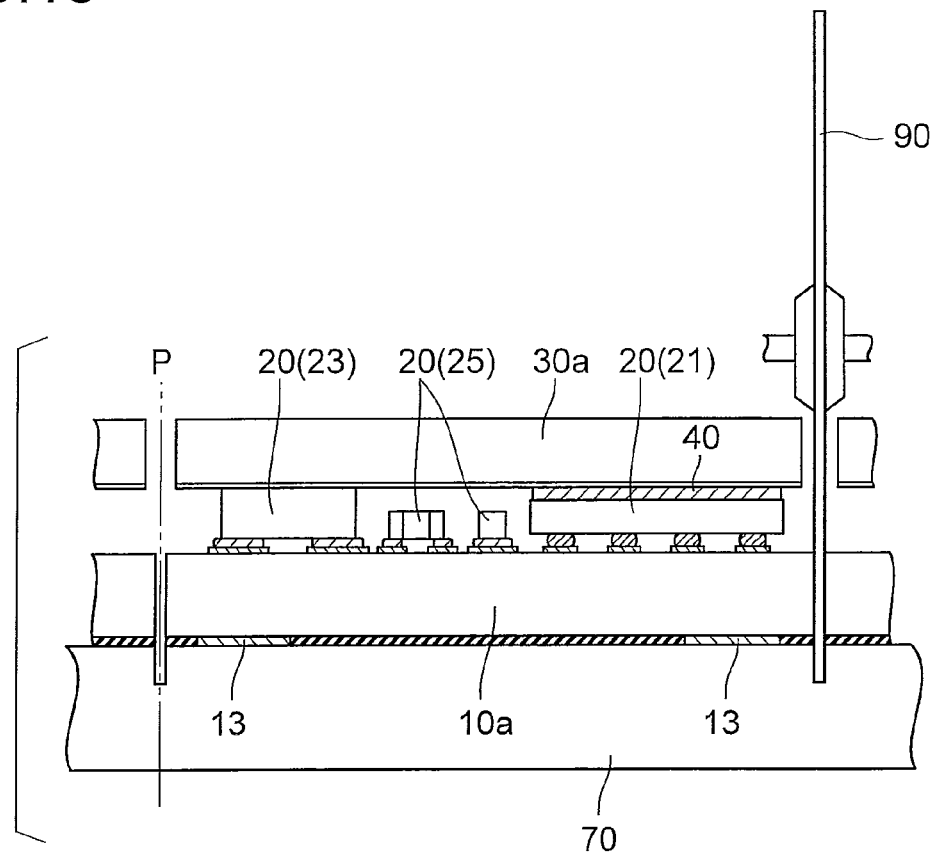
FIG. 18 is a cross sectional view for illustrating the manufacturing method of the electronic component module according to the first embodiment of the present invention.

Here, in the first embodiment, as illustrated in FIG. 17, a dicing sheet 70 is glued to the back surface of the substrate aggregate 10a, and then only the top plate aggregate 30a is first cut along the dicing line P by using a first dicing blade 80. Next, as illustrated in FIG. 18, only the substrate aggregate 10a is cut along the dicing line P by using a second dicing blade 90. In this case, the first dicing blade 80 for cutting the top plate aggregate 30a has a blade thickness larger than that of the second dicing blade 90 for cutting the substrate aggregate 10a, so that the cutting width (dicing width) of the top plate aggregate 30a is larger than the cutting width (dicing width) of the substrate aggregate 10a. Thus, as illustrated in FIG. 4, the outside dimension of the top plate 30 is smaller than the outside dimension of the module substrate 10.

In this way, the electronic component module 100 according to the first embodiment of the present invention is manufactured.

In the manufacturing method of the electronic component module 100 according to the first embodiment, with the above-mentioned structure, the top plate 30 and the module substrate 10 can be moved in a sheet-like state during the process. Therefore, the process until splitting can be performed as a batch process. Therefore, the electronic component module 100 can be manufactured with very high production efficiency.

First Variation Example

FIGS. 19 to 23 are diagrams for illustrating a first variation example of the manufacturing method of the electronic component module according to the first embodiment. Next, with reference to FIGS. 5, 12, 13, 15, and 17 to 23, a first variation example of the manufacturing method of the electronic component module according to the first embodiment will be described.

In this first variation example, unlike the above-mentioned first embodiment, the metal plate is glued to the top plate aggregate. After that, the metal plate is patterned so as to form the top plate holding member in a predetermined region on the top plate aggregate.

Specifically, using the same method as the first embodiment illustrated in FIGS. 12 and 13, the electronic components 20 are mounted in the component mounting region 10b on the substrate aggregate 10a (module substrates 10).

Figure 19:
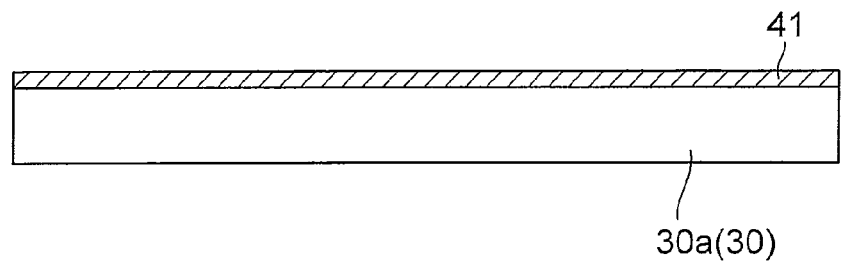
FIG. 19 is a cross sectional view for illustrating a first variation example of the manufacturing method of the electronic component module according to the first embodiment.

Next, as illustrated in FIG. 19, a metal plate 41 having a thickness (approximately 0.05 to 0.25 mm) that is substantially the same as a height difference between the quartz resonator 23 (see FIG. 5) and the RF-IC 21 (see FIG. 5) is glued onto one surface of the top plate aggregate 30a.

Figure 20:
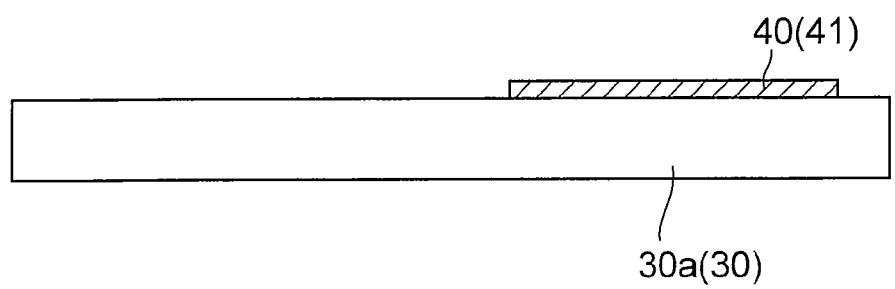
FIG. 20 is a cross sectional view for illustrating the first variation example of the manufacturing method of the electronic component module according to the first embodiment.
Figure 21:
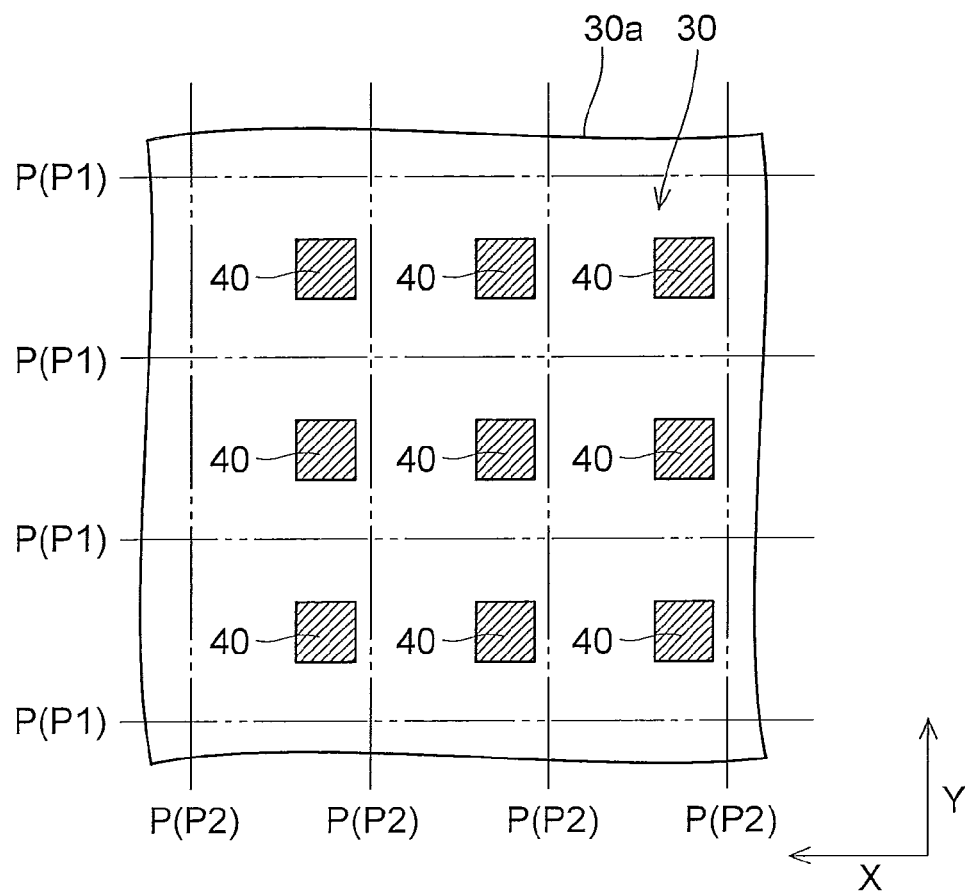
FIG. 21 is a plan view for illustrating the first variation example of the manufacturing method of the electronic component module according to the first embodiment.

Then, as illustrated in FIGS. 20 and 21, the metal plate 41 (see FIG. 19) is patterned by using the photolithography technique and the etching technique, so that the top plate holding member 40 made of metal plate is formed. In this case, the top plate holding member 40 is formed to have a length dimension of 3.5 mm and a width dimension of 3.5 mm, for example. In addition, the patterning is performed so that the top plate holding member 40 is positioned in the region corresponding to the RF-IC 21 (see FIG. 15) mounted on the substrate aggregate 10a (see FIG. 15). Thus, the top plate aggregate 30a with the top plate holding member 40 is formed.

Figure 22:
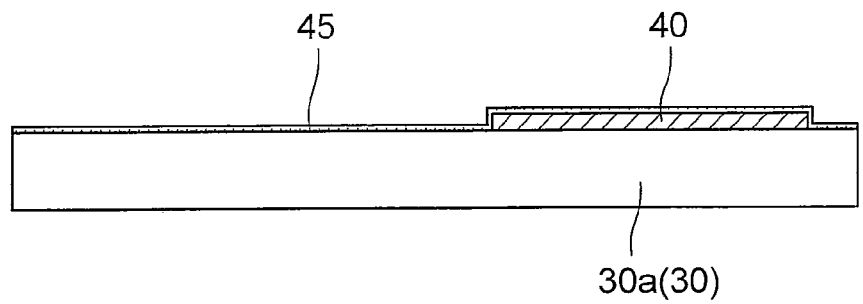
FIG. 22 is a cross sectional view for illustrating the first variation example of the manufacturing method of the electronic component module according to the first embodiment.

Next, as illustrated in FIG. 22, the adhesive layer 45 is formed on the top plate aggregate 30a in the entire region of the surface on which the top plate holding member 40 is formed.

Figure 23:
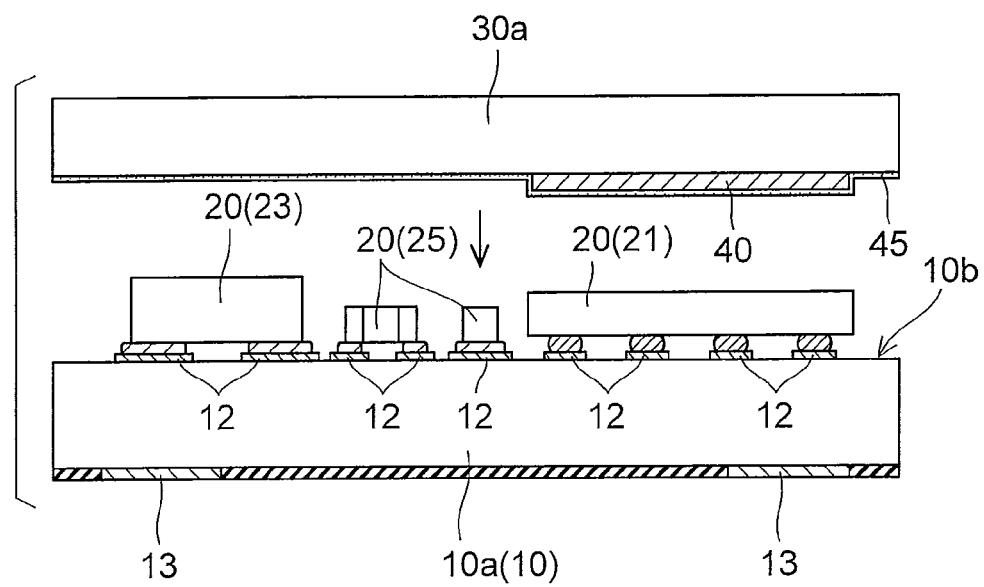
FIG. 23 is a cross sectional view for illustrating the first variation example of the manufacturing method of the electronic component module according to the first embodiment.

After that, as illustrated in FIG. 23, the top plate aggregate 30a with the top plate holding member 40 is fixed to a part of the electronic component 20 mounted in the component mounting region 10b of the substrate aggregate 10a. Specifically, the top plate aggregate 30a is fixed to the top surface of the quartz resonator 23 as a tall component via the adhesive layer 45, and the top plate holding member 40 is fixed to the top surface of the RF-IC 21.

Finally, the same method as the first embodiment illustrated in FIGS. 17 and 18 is used for obtaining individual electronic component modules.

According to the manufacturing method of the first variation example, as described above, the metal plate 41 is glued to the top plate aggregate 30a and then the metal plate 41 is patterned so that the top plate holding member 40 is formed. Thus, the top plate holding member 40 can be formed accurately and can be disposed in the region corresponding to the RF-IC 21 accurately. Thus, it is possible to manufacture easily the electronic component module that has high reliability and can suppress a decrease of handling performance of the mounting machine.

Note that other effects of the first variation example are the same as those of the first embodiment.

Second Variation Example

FIGS. 24 to 29 are diagrams for illustrating a second variation example of the manufacturing method of the electronic component module according to the first embodiment. Next, with reference to FIGS. 5 and 24 to 29, the second variation example of the manufacturing method of the electronic component module according to the first embodiment will be described.

In this second variation example, the top plate holding member is formed on another plate member, and then the formed top plate holding member is transferred onto the top plate aggregate so that a top plate aggregate with the top plate holding member is formed.

Figure 24:
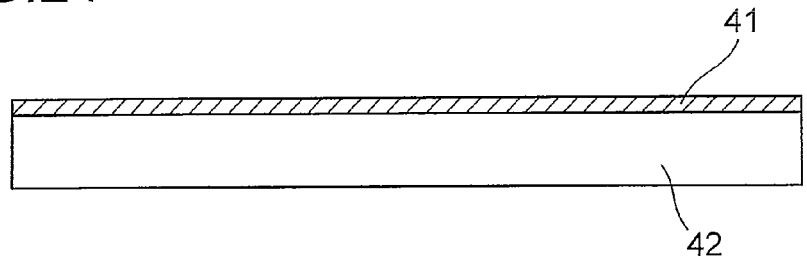
FIG. 24 is a cross sectional view for illustrating a second variation example of the manufacturing method of the electronic component module according to the first embodiment.

Specifically, first as illustrated in FIG. 24, the metal plate 41 having a thickness (approximately 0.05 to 0.25 mm) that is substantially the same as a height difference between the quartz resonator 23 (see FIG. 5) and the RF-IC 21 (see FIG. 5) is glued onto one surface of a plate member 42. In this case, adhesive having relatively small adhesion is used for gluing the metal plate 41 to the plate member 42 so that the metal plate 41 can easily removed from the plate member 42 in the later step.

Figure 25:
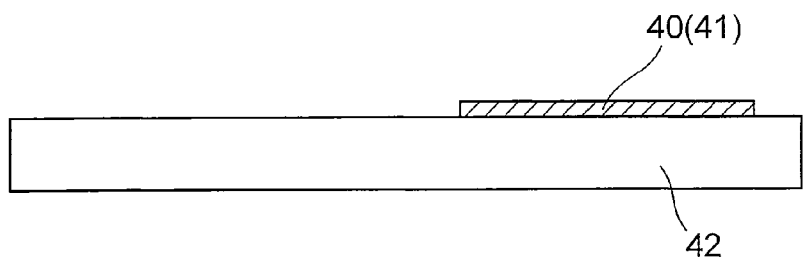
FIG. 25 is a cross sectional view for illustrating the second variation example of the manufacturing method of the electronic component module according to the first embodiment.
Figure 26:
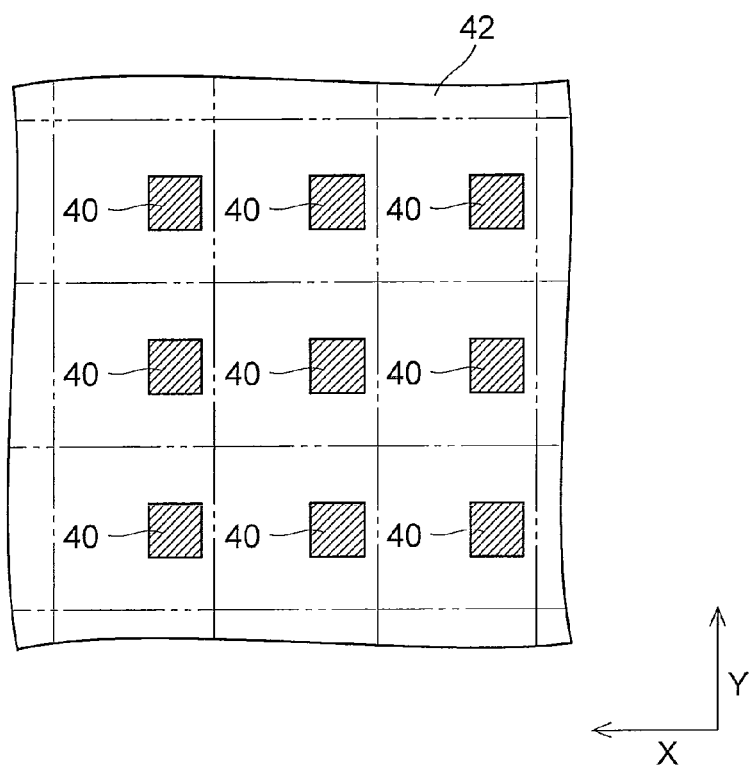
FIG. 26 is a plan view for illustrating the second variation example of the manufacturing method of the electronic component module according to the first embodiment.

Next, as illustrated in FIGS. 25 and 26, similarly to the first variation example, the metal plate 41 is patterned by using the photolithography technique and the etching technique, so that the top plate holding member 40 constituted of the metal plate is formed.

Figure 27:
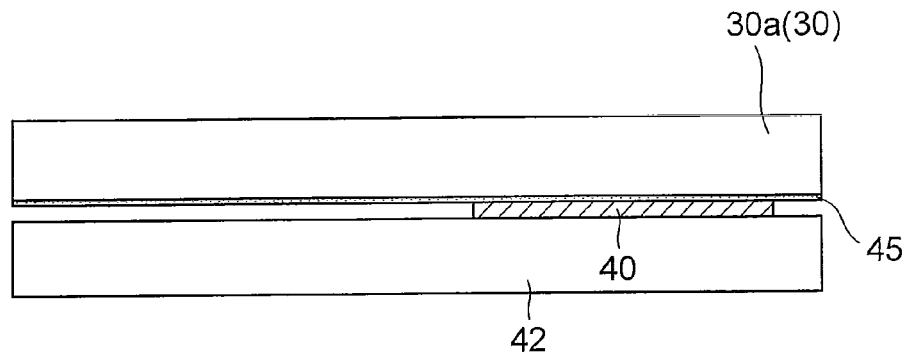
FIG. 27 is a cross sectional view for illustrating the second variation example of the manufacturing method of the electronic component module according to the first embodiment.
Figure 28:
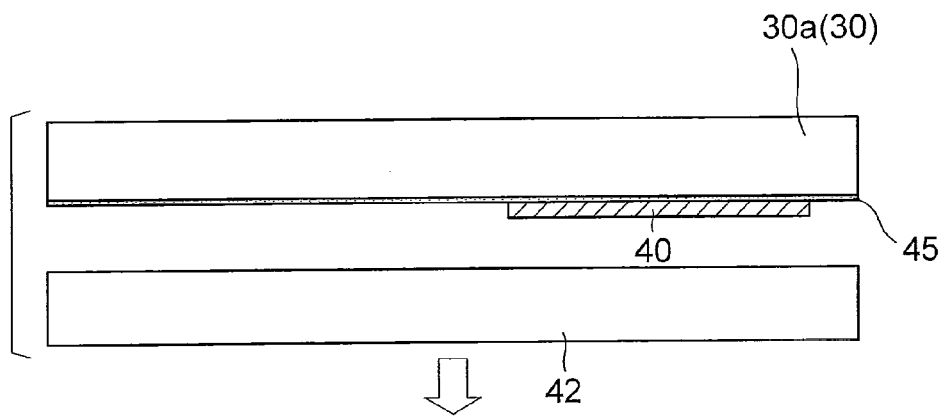
FIG. 28 is a cross sectional view for illustrating the second variation example of the manufacturing method of the electronic component module according to the first embodiment.

Next, as illustrated in FIG. 27, the top plate aggregate 30a with the adhesive layer 45 formed on one surface is glued to the plate member 42 on which the top plate holding member 40 is formed. Then, as illustrated in FIG. 28, the plate member 42 is removed so that the top plate holding member 40 formed on the plate member 42 is transferred onto the top plate aggregate 30a. Thus, the top plate aggregate 30a with the top plate holding member 40 is formed.

Figure 29:
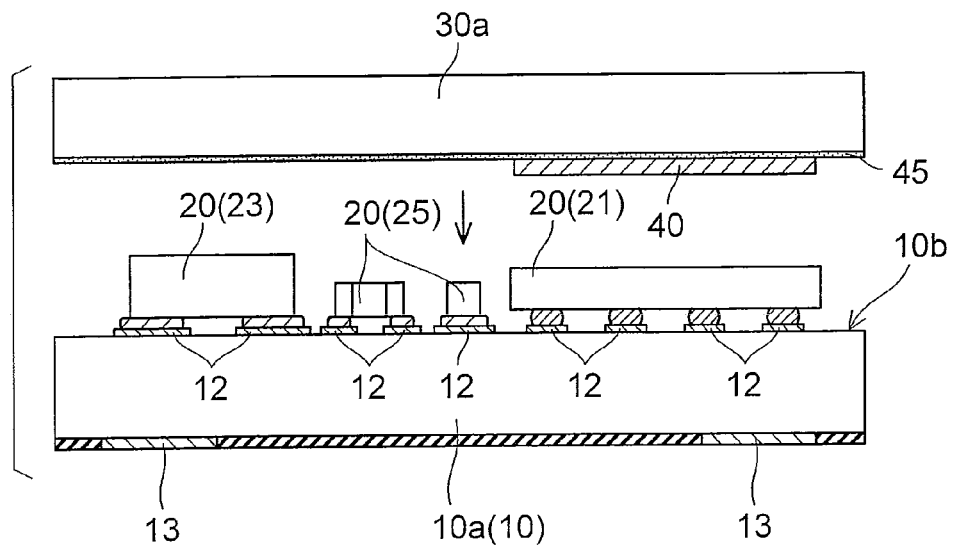
FIG. 29 is a cross sectional view for illustrating the second variation example of the manufacturing method of the electronic component module according to the first embodiment.

After that, as illustrated in FIG. 29, the top plate aggregate 30a with the top plate holding member 40 is fixed to a part of the electronic component 20 mounted in the component mounting region 10b of the substrate aggregate 10a.

Note that other structure of the second variation example is the same as that of the first variation example.

In addition, effects of the second variation example is the same those of the first embodiment and the first variation example.

Third Variation Example

Figure 30:
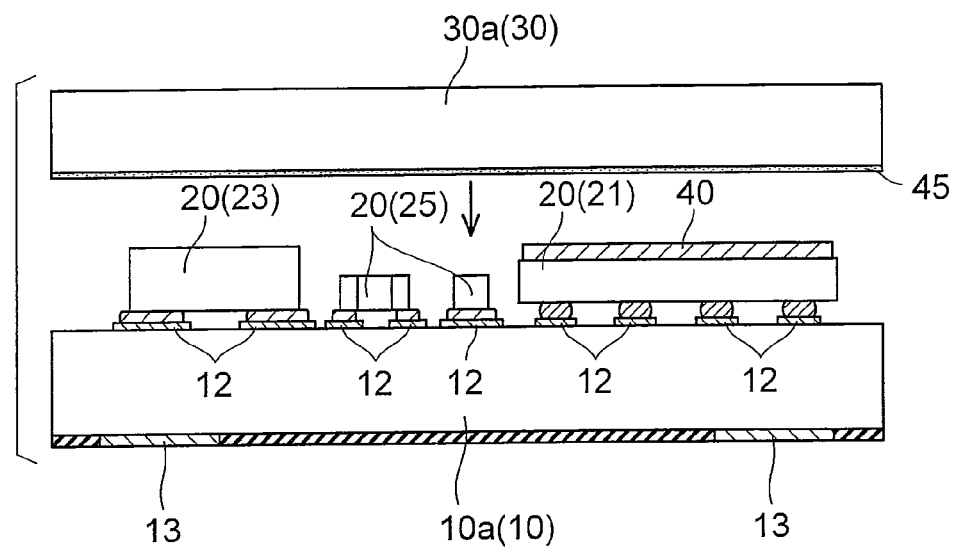
FIG. 30 is a cross sectional view for illustrating a third variation example of the manufacturing method of the electronic component module according to the first embodiment.

FIG. 30 is a cross sectional view for illustrating a third variation example of the manufacturing method of the electronic component module according to the first embodiment. Next, with reference to FIG. 30, the third variation example of the manufacturing method of the electronic component module according to the first embodiment will be described.

In this third variation example, as illustrated in FIG. 30, the top plate holding member 40 is fixed to the top surface of the RF-IC 21, and then the top plate aggregate 30a is fixed to the top surface of the quartz resonator 23 and the top plate holding member 40.

Note that other structure of the third variation example is the same as that of the first embodiment. In addition, effects of the third variation example are the same as those of the first embodiment.

(Second Embodiment)

Figure 31:
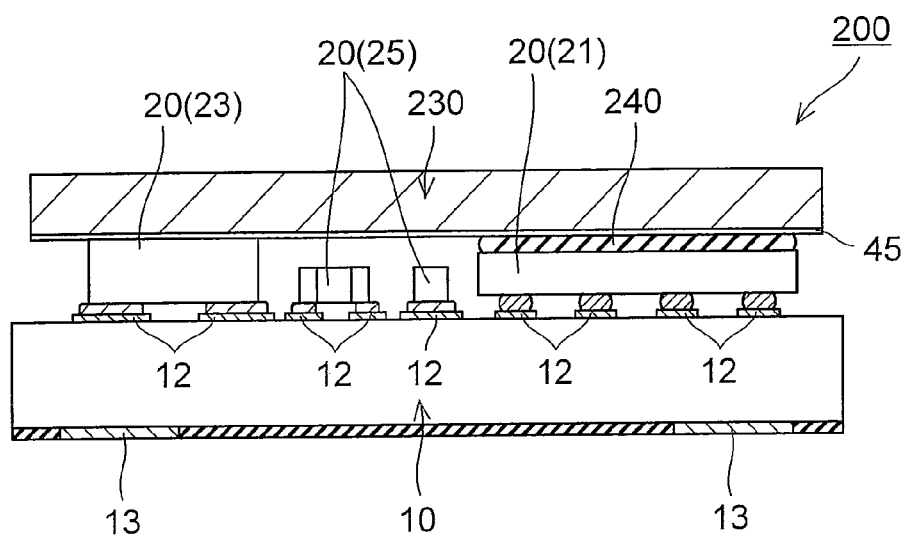
FIG. 31 is a cross sectional view of the electronic component module according to a second embodiment of the present invention.

FIG. 31 is a cross sectional view of the electronic component module according to the second embodiment of the present invention. Next, with reference to FIGS. 5 and 31, a structure of the electronic component module 200 according to the second embodiment of the present invention will be described.

In the electronic component module 200 according to the second embodiment, unlike the first embodiment, the top plate is made of metal plate, and the top plate holding member is made of a curable resin material. In other words, in the second embodiment, as illustrated in FIG. 31, a top plate 230 made of metal plate is disposed instead of the top plate 30 constituted of the insulating plate (see FIG. 5). In addition, in the second embodiment, a top plate holding member 240 made of a curable resin material disposed instead of the top plate holding member 40 constituted of the metal plate (see FIG. 5).

The top plate 230 is made of metal plate such as copper plate or aluminum plate and has a thickness of approximately 0.1 to 0.3 mm similarly to the first embodiment. In addition, the top plate holding member 240 is made of a thermosetting resin such as epoxy resin, underfill resin, thermosetting polyimide resin, or the like.

Note that other structure of the second embodiment is the same as that of the first embodiment.

In the second embodiment, as described above, the top plate 230 is made of metal plate, so that the top plate 230 covering the electronic component 20 can have a shielding effect. Therefore, it is easy to shield against high frequency noise and the like. In addition, with this structure, it is also possible to suppress incoming external noise. Note that a gap is generated between the module substrate 10 and the top plate 230 when the planar top plate 230 is attached, but the gap is approximately 0.4 to 0.5 mm, so a sufficient shielding effect can be obtained.

In addition, in the second embodiment, since the top plate 230 is made of metal plate, the top plate 230 can be formed without using a die. Thus, it is also possible to suppress an increase in facility cost and manufacturing cost. In other words, if a metal case is attached to an electronic component module for shielding against high frequency noise and the like, a processing die for manufacturing the metal case is necessary. Therefore, initial cost for manufacturing the die is very high, so there is the inconvenience that facility cost and manufacturing cost increase. In contrast, if the top plate 230 is made of metal plate, the die for manufacturing the metal case or the like is unnecessary. Therefore, an increase in facility cost and the like can be suppressed so that manufacturing cost of the electronic component module can be reduced.

In addition, in the second embodiment, if the top plate holding member 240 is made of a thermosetting resin, the top plate holding member 240 disposed between the RF-IC 21 and the top plate 230 can easily be formed. Note that the top plate holding member 240 may be made of an electrically conductive thermosetting resin containing metal powder (e.g., aluminum powder or the like), metal filler (e.g., Ag filler or the like), or the like. If this structure is adopted, the top plate holding member 240 can have a shielding effect. Therefore, if the top plate holding member 240 is disposed so as to cover the top surface of the RF-IC 21, it is possible to shield more effectively against high frequency noise and the like.

Other effects of the second embodiment are the same as those of the first embodiment.

Figure 32:
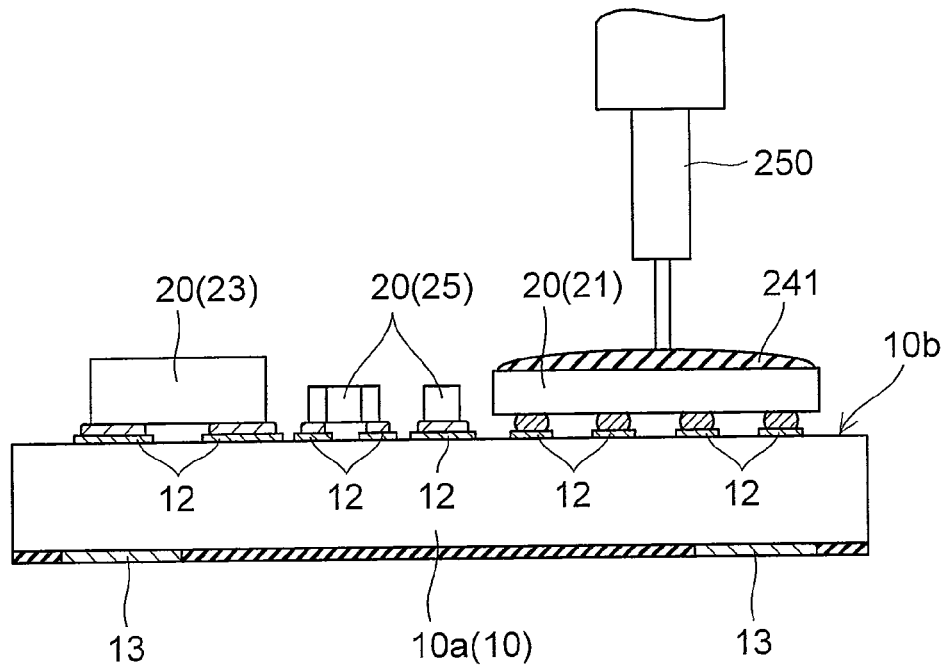
FIG. 32 is a cross sectional view for illustrating a manufacturing method of the electronic component module according to the second embodiment of the present invention.
Figure 33:
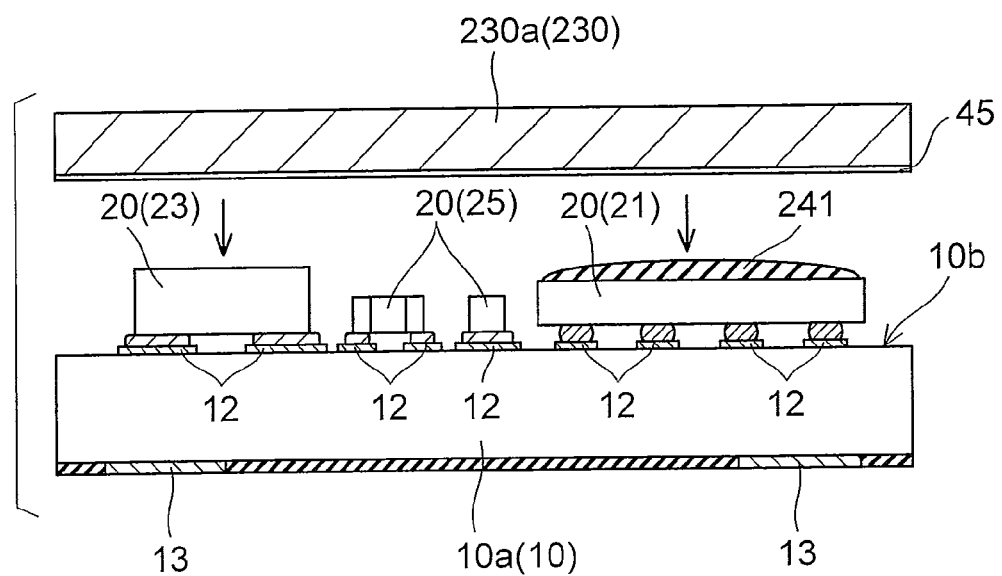
FIG. 33 is a cross sectional view for illustrating a manufacturing method of the electronic component module according to the second embodiment of the present invention.

FIGS. 32 and 33 are cross sectional views for illustrating a manufacturing method of the electronic component module according to the second embodiment of the present invention. Next, with reference to FIGS. 12, 17, 18, 32 and 33, a manufacturing method of the electronic component module 200 according to the second embodiment of the present invention will be described.

First, the electronic components 20 are mounted in the component mounting region 10b of the substrate aggregate 10a (module substrate 10) by using the same method as that of the first embodiment illustrated in FIG. 12.

Next, as illustrated in FIG. 32, liquid-like resin 241 (thermosetting resin before being cured) is coated on the top surface of the RF-IC 21 by using an injector 250. In this case, it is preferable to adjust the amount of coating the liquid-like resin 241 to be substantially equal to the top surface of the quartz resonator 23.

Next, as illustrated in FIG. 33, a top plate aggregate 230a with the adhesive layer 45 formed on one surface is fixed to a part of the electronic component 20 mounted in the component mounting region 10b of the substrate aggregate 10a. Specifically, the top plate aggregate 230a is fixed to the top surface of the quartz resonator 23 as a tall component via the adhesive layer 45 and is made to contact with the liquid-like resin 241 coated on the top surface of the RF-IC 21. Then, the liquid-like resin 241 is cured by heat so that the top plate holding member 240 for holding the top plate 230 is formed between the top plate 230 and the RF-IC 21.

After that, the individual electronic component modules are obtained by using the same method as that of the first embodiment illustrated in FIGS. 17 and 18. In this way, the electronic component module 200 according to the second embodiment is manufactured.

In the manufacturing method of the electronic component module 200 according to the second embodiment, with the above-mentioned structure, the step of manufacturing the top plate holding member 240 can be simplified. Therefore, the manufacturing process of the electronic component module can be simplified. Thus, even if the top plate holding member 240 is disposed between the top plate 230 and the RF-IC 21, an increase in manufacturing cost can be suppressed.

Other methods of the manufacturing method according to the second embodiment are the same as those of the manufacturing method according to the first embodiment.

(Third Embodiment)

Figure 34:
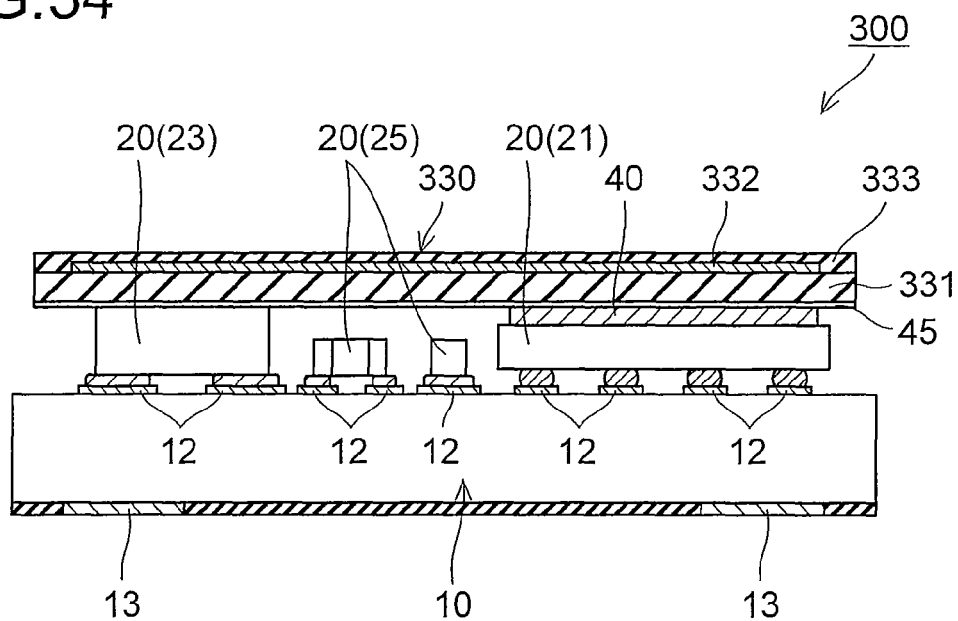
FIG. 34 is a cross sectional view of the electronic component module according to a third embodiment of the present invention.
Figure 35:
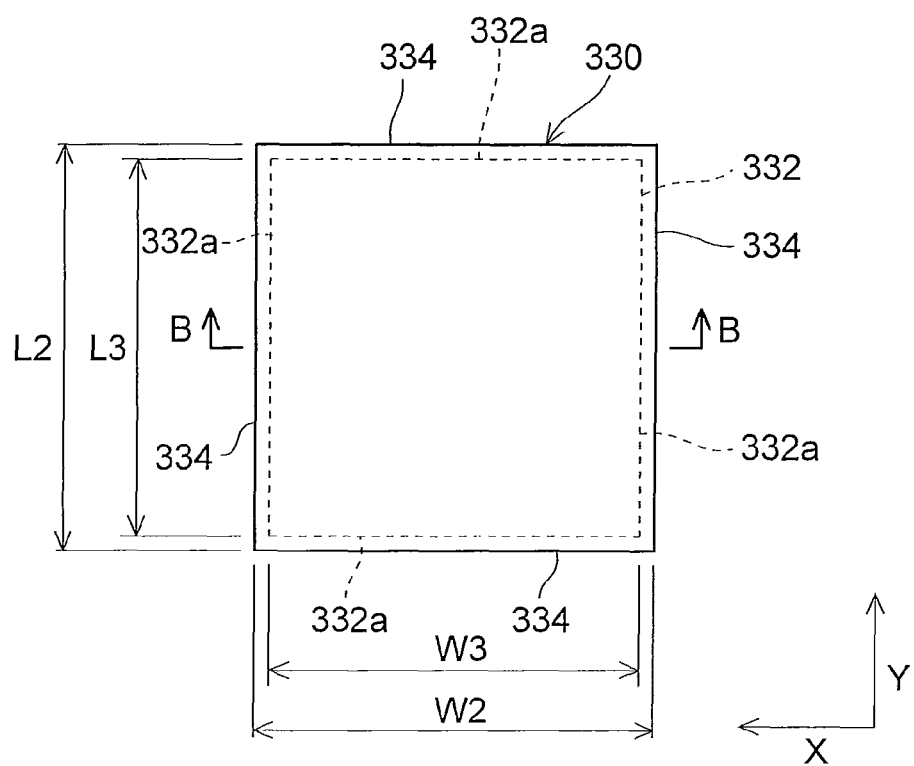
FIG. 35 is a plan view of a top plate of the electronic component module according to the third embodiment of the present invention.
Figure 36:
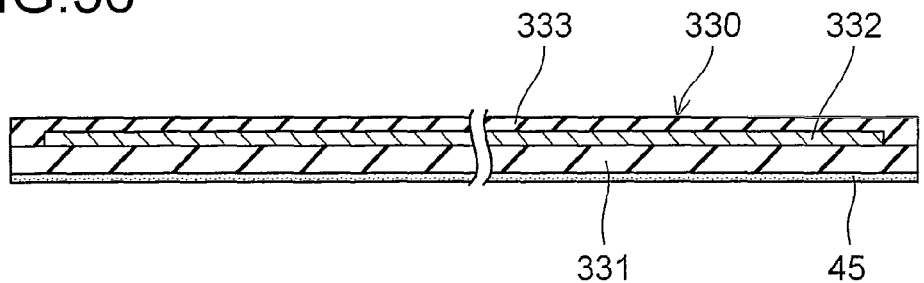
FIG. 36 is a cross sectional view cut along the line B-B in FIG. 35.

FIG. 34 is a cross sectional view of the electronic component module according to the third embodiment of the present invention. FIG. 35 is a plan view of the top plate of the electronic component module according to the third embodiment of the present invention. FIG. 36 is a cross sectional view cut along the line B-B in FIG. 35. Next, with reference to FIGS. 5 and 34 to 36, a structure of the electronic component module 300 according to the third embodiment of the present invention will be described.

This electronic component module 300 according to the third embodiment has a top plate 330 having a composite structure instead of the top plate 30 constituted of the insulating plate (see FIG. 5) in the structure of the first embodiment. Specifically, in the third embodiment, as illustrated in FIGS. 34 and 36, the top plate 330 has the composite structure (lamination structure) including a planar base material portion 331 having insulating property, an electrically conductive foil 332 glued onto one principal surface of the base material portion 331, and an insulating layer 333 formed on the one principal surface of the base material portion 331 so as to cover the electrically conductive foil 332. In addition, the base material portion 331 constituting the top plate 330 is constituted of a glass epoxy material (glass fabric base epoxy resin plate) having a thickness of approximately 0.1 mm, and the electrically conductive foil 332 is constituted of a copper foil having a thickness of approximately 18 μm. Further, the insulating layer 333 is constituted of solder resist and is formed on the one principal surface of the base material portion 331 so that the thickness of the electrically conductive foil 332 becomes approximately 30 μm. Note that the insulating layer 333 is an example of the "insulating member" in the present invention.

In addition, in the third embodiment, as illustrated in FIG. 35, the top plate 330 (base material portion 331) is formed in a square shape having four sides (outer edges) 334 in a plan view. Specifically, the top plate 330 is formed to have a width W2 of approximately 5.6 mm in X direction and a length L2 of approximately 5.6 mm in Y direction. In other words, in the third embodiment, similarly to the first and the second embodiments, the top plate 330 is formed to have a flat surface area which is a little smaller than that of the module substrate 10.

In addition, in the third embodiment, the top plate 330 is constituted so that the edge portion of the electrically conductive foil 332 is inside the base material portion 331. Specifically, the electrically conductive foil 332 is formed to have a square shape with four sides (outer edges) 332a in a plan view, which has a width W3 of approximately 5.6 mm in X direction and a length L3 of approximately 5.6 mm in Y direction. Then, the electrically conductive foil 332 is disposed in the middle portion of the base material portion 331 so that the sides (outer edges) 332a of the electrically conductive foil 332 is inside the individual sides 334 of the base material portion 331 (top plate 330) in a plan view. In addition, with the above-mentioned structure, the top plate 330 has a predetermined flexibility under the operation condition of the electronic component module 300.

In addition, the adhesive layer 45 similar to the first embodiment (see FIGS. 34 and 36) is formed on the back surface of the top plate 330 (the surface of the base material portion 331 opposite to the electrically conductive foil 332), so that the top plate 330 is fixed to the top surface of the quartz resonator 23 (see FIG. 34) via the adhesive layer 45.

Other structure of the third embodiment is the same as that of the first embodiment.

In the third embodiment, as described above, the top plate 330 is constituted to have a composite structure including the insulating base material portion 331, and the electrically conductive foil 332 formed on the base material portion 331, so that the top plate 330 covering the electronic component 20 has a shielding effect. Thus, it is possible to shield easily against high frequency noise and the like. In addition, with this structure, it is also possible to suppress incoming external noise. Note that a gap is generated between the module substrate 10 and the top plate 330 when the planar top plate 330 is attached, but the gap is approximately 0.4 to 0.5 mm, so a sufficient shielding effect can be obtained.

In addition, in the third embodiment, since the top plate 330 is constituted to have a composite structure (lamination structure) including the planar base material portion 331 made of glass epoxy material, the electrically conductive foil 332 glued onto the one principal surface of the base material portion 331, and the insulating layer 333 formed on the one principal surface of the base material portion 331 so as to cover the electrically conductive foil 332, the top plate 330 can be formed by using the manufacturing process of a printed circuit board or the like. Therefore, the top plate 330 having a shielding effect can be provided more easily.

In addition, in the third embodiment, since the top plate 330 is constituted to have the composite structure including the base material portion 331 made of glass epoxy material, the top plate 330 can have flexibility. Therefore, even if an impact load from the mounter head is applied to the top plate 330, the top plate 330 can be bent so that the impact load applied to the electronic component module 300 can effectively be reduced. Thus, withstand load performance of the electronic component module 300 can be improved. In addition, if the impact load applied to the electronic component module 300 is reduced, damages to the RF-IC 21 and the quartz resonator 23 to which the top plate 330 is fixed can effectively be suppressed.

In addition, in the third embodiment, since the top plate 330 is formed by using the base material portion 331 made of glass epoxy material, the top plate 330 can be manufactured without using a die. Therefore, an initial cost for manufacturing the die is unnecessary. Therefore, an increase in facility cost can be suppressed so that facility cost which is added to production cost (manufacturing cost) can be reduced. Thus, the production cost (manufacturing cost) can be reduced.

In addition, in the third embodiment, the electrically conductive foil 332 is formed to have a flat surface area smaller than that of the base material portion 331, and the electrically conductive foil 332 is disposed so that the sides (outer edges) 32a of the electrically conductive foil 332 are inside the sides (outer edges) 34 of the top plate 330 (base material portion 331) in a plan view. Therefore, since the electrically conductive foil 332 is sealed by the insulating layer 333, an occurrence of an electric short circuit with a peripheral component, leak, or the like can be suppressed even if the top plate 330 is detached in the state of being mounted on the mounting substrate.

In addition, in the third embodiment, since the insulating layer 333 covering the electrically conductive foil 332 is formed on the base material portion 331 of the top plate 330, an occurrence of an electric short circuit with a peripheral component, leak, or the like can securely be suppressed even if the top plate 330 is detached in the state of being mounted on the mounting substrate.

Other effects of the third embodiment are the same as those of the first embodiment.

Figure 37:
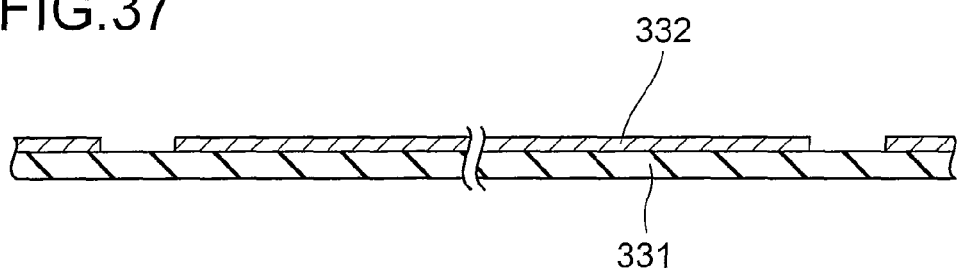
FIG. 37 is a cross sectional view for illustrating a manufacturing method of the electronic component module according to the third embodiment of the present invention.
Figure 38:
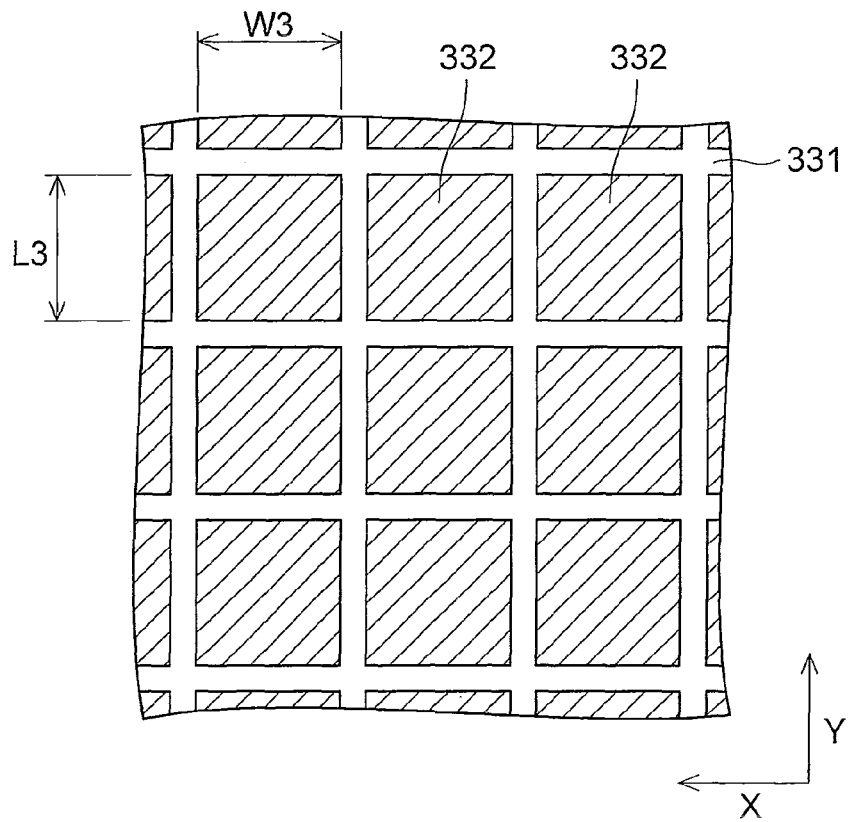
FIG. 38 is a plan view for illustrating a manufacturing method of the electronic component module according to the third embodiment of the present invention.
Figure 39:
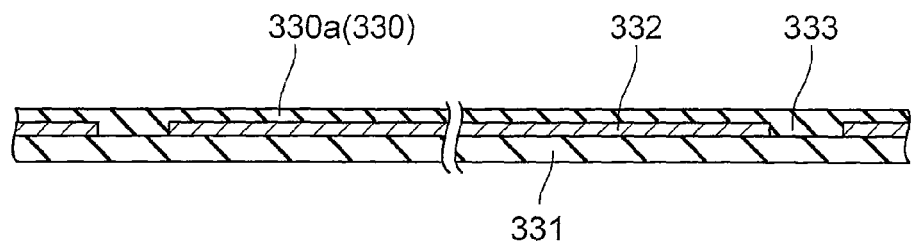
FIG. 39 is a cross sectional view for illustrating a manufacturing method of the electronic component module according to the third embodiment of the present invention.

FIGS. 37 to 39 are diagrams for illustrating the manufacturing method of the electronic component module according to the third embodiment of the present invention. Next, with reference to FIGS. 37 to 39, the manufacturing method of the electronic component module 300 according to the first embodiment of the present invention will be described. Note that the manufacturing process of others than the top plate 330 in the third embodiment is the same as that in the first embodiment. Therefore, hereinafter, only the manufacturing method of the top plate 330 (top plate aggregate 330a) will be described.

First, as illustrated in FIG. 37, prepare the planar base material portion 331 made of glass epoxy material having a thickness of approximately 0.1 mm which is used for manufacturing a printed circuit board or the like. Next, a copper foil with adhesive having a thickness of approximately 18 μm is thermally compressed and bonded onto one principal surface of the base material portion 331, and the copper foil is patterned to be a square shape by etching or the like. Thus, as illustrated in FIG. 38, the plurality of electrically conductive foils 332 made of copper foil are formed in a matrix on the base material portion 331.

Next, as illustrated in FIG. 39, paste solder resist is printed on the entire surface of the one principal surface of the base material portion 331 on which the electrically conductive foils 332 are formed by using a printing method or the like and is cured thermally. Thus, the insulating layer 333 is formed on the one principal surface of the base material portion 331 so as to cover the electrically conductive foil 332, so that the top plate aggregate 330a having the composite structure is formed. This top plate aggregate 330a has a structure in which a plurality of top plates 330 are coupled similarly to the first and the second embodiments, which is split into individual top plates 330 by dicing in the later step.

(Fourth Embodiment)

Figure 40:
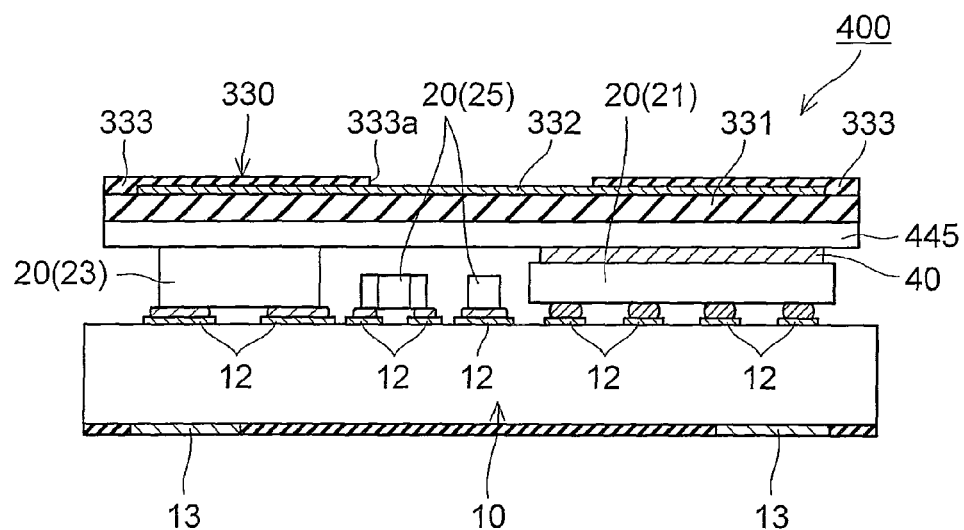
FIG. 40 is a cross sectional view of the electronic component module according to a fourth embodiment of the present invention.
Figure 41:
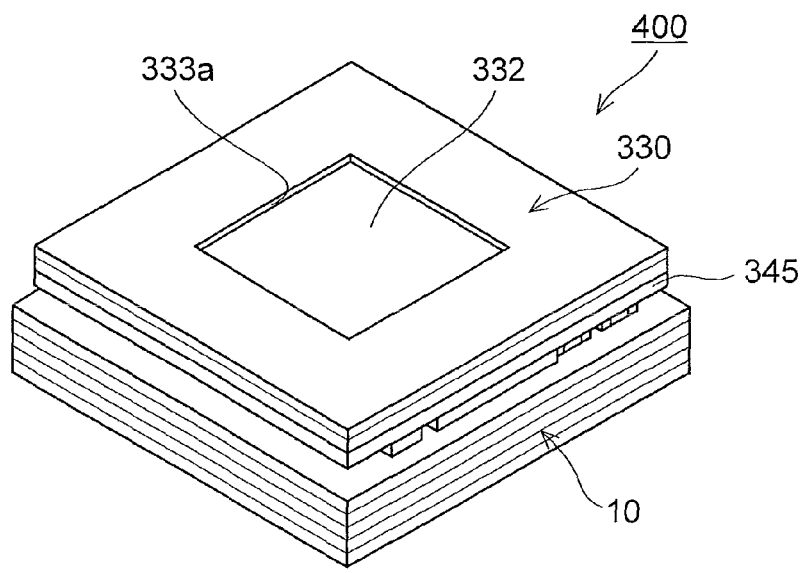
FIG. 41 is a general perspective view of the electronic component module according to the fourth embodiment of the present invention.

FIG. 40 is a cross sectional view of the electronic component module according to the fourth embodiment of the present invention. FIG. 41 is a general perspective view of the electronic component module according to the fourth embodiment of the present invention. Next, with reference to FIGS. 40 and 41, a structure of the electronic component module 400 according to the fourth embodiment of the present invention will be described.

In the electronic component module 400 according to the fourth embodiment, an elastic member 445 having an elastic function and an adhesive function is disposed between the top plate 330 and the electronic component 20 in the structure of the third embodiment. Then, by the elastic member 445, the top plate 330 is fixed to the quartz resonator 23 and the top plate holding member 40 (RF-IC 21).

The elastic member 445 is constituted of a sheet-like epoxy resin having low elasticity and a thickness of approximately 25 to 100 μm (e.g., approximately 50 μm), and has an elasticity modulus of approximately 1 to 200 MPa under the operation condition of the electronic component module 400. In addition, as illustrated in FIG. 40, the sheet-like elastic member 445 is fixed in advance onto the entire surface of the other principal surface of the top plate 330 (surface facing the electronic component 20) by thermocompression bonding. Note that the other principal surface of the top plate 330 to which the elastic member 445 is fixed is processed with a surface roughing treatment such as argon plasma treatment for improving adhesion between the elastic member 445 and the top plate 330. By the surface roughing treatment, the other principal surface of the top plate 330 has a surface roughness (arithmetic mean surface roughness, Ra) of approximately 400 nm.

In addition, as the elastic member 445, it is possible to use die bonding sheet (die bonding film), for example, which is used for die bonding a semiconductor chip. Note that it is preferable to use the die bonding sheet (die bonding film) that has an elasticity modulus of approximately 100 MPa measured by a dynamic viscoelasticity measuring method (DMA) at 23 degrees centigrade.

In addition, in the fourth embodiment, as illustrated in FIGS. 40 and 41, an opening portion 333a is formed at a predetermined portion of the insulating layer 333 of the top plate 330. Then, through this opening portion 333a, a part of the electrically conductive foil 332 is exposed to the opposite side of the electronic component 20.

The other structure of the fourth embodiment is the same as that of the third embodiment.

In the fourth embodiment, as described above, the planar top plate 330 is fixed to the electronic component 20 via the elastic member 445 having the elastic function. Thus, when the electronic component module 400 is mounted on the mounting substrate 60 such as the printed circuit board, an impact from the mounter head can be absorbed by the elastic member 445. Therefore, since the impact load applied to the electronic components 20 (quartz resonator 23 and RF-IC 21) can be reduced, the withstand load performance can be improved. Thus, a damage to the mounted electronic components 20 (quartz resonator 23 and RF-IC 21) can be suppressed, and a break in electric connection between the electronic component 20 and the module substrate 10 can be suppressed. As a result, reliability can also be improved.

In addition, in the fourth embodiment, the opening portion 333a is formed in a predetermined portion of the insulating layer 333 so as to expose a part of the electrically conductive foil 332. Therefore, a part of the electrically conductive foil 332 exposed through the opening portion 333a is electrically connected to the ground portion of the electronic equipment (not shown) on which the electronic component module 400 is mounted, for example, so that a ground shielding effect can easily be obtained.

Other effect of the fourth embodiment is the same as those of the third embodiment.

Figure 42:
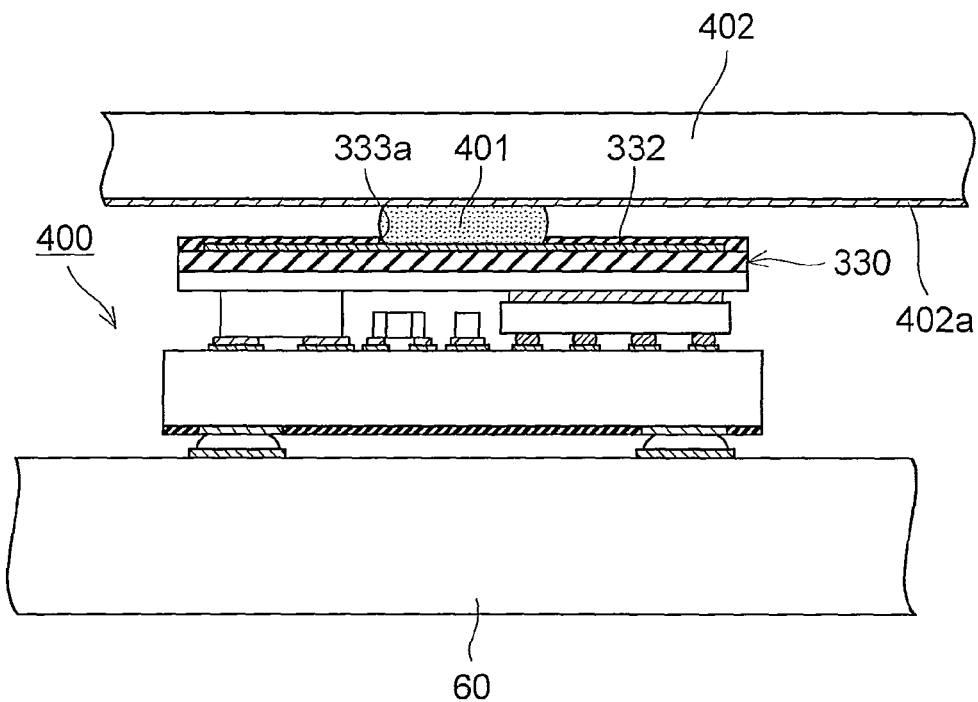
FIG. 42 is a cross sectional view illustrating a first mounting example of the electronic component module according to the fourth embodiment of the present invention.
Figure 43:
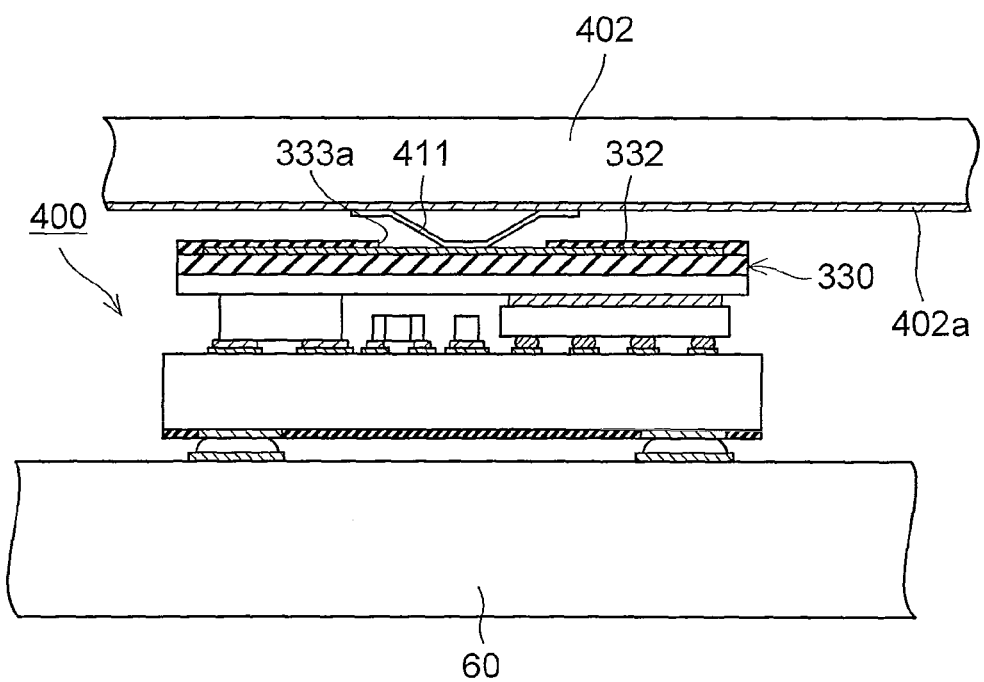
FIG. 43 is a cross sectional view illustrating a second mounting example of the electronic component module according to the fourth embodiment of the present invention.
Figure 44:
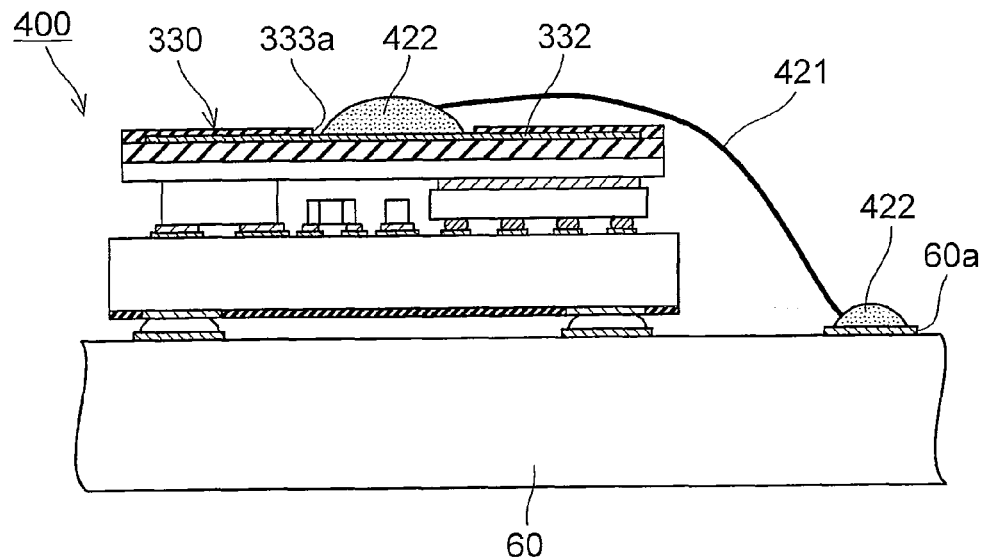
FIG. 44 is a cross sectional view illustrating a third mounting example of the electronic component module according to the fourth embodiment of the present invention.

FIGS. 42 to 44 are cross sectional views illustrating mounting examples of the electronic component module according to the fourth embodiment of the present invention. Note that FIG. 42 illustrates a first mounting example, FIG. 43 illustrates a second mounting example, and FIG. 44 illustrates a third mounting example. Next, with reference to FIGS. 42 to 44, the mounting examples of the electronic component module 400 according to the fourth embodiment of the present invention will be described.

In the first mounting example of the electronic component module 400 according to the fourth embodiment, as illustrated in FIG. 42, the electronic component module 400 is mounted on the mounting substrate 60. In this state, an electrically conductive elastic member 401 electrically connects the conductive layer 402a for the ground formed on the casing 402 of the electronic equipment with a part of the electrically conductive foil 332 exposed through the opening portion 333a. Thus, the potential of the electrically conductive foil 332 of the top plate 330 can be the same potential as the GND potential, so that the ground shielding effect can be obtained.

Note that the electrically conductive elastic member 401 may be, for example, die bonding sheet having an electrically conductive property, electrically conductive paste made of epoxy material containing Ag filler or various metal filler, or the like.

In the second mounting example of the electronic component module 400 according to the fourth embodiment, as illustrated in FIG. 43, the electronic component module 400 is mounted on the mounting substrate 60. In this state, a spring member 411 having a spring function and an electrically conductive property electrically connects the conductive layer 402a for the ground formed on the casing 402 of the electronic equipment with a part of the electrically conductive foil 332 exposed through the opening portion 333a.

In the third mounting example of the electronic component module 400 according to the fourth embodiment, as illustrated in FIG. 44, the electronic component module 400 is mounted on the mounting substrate 60. In this state, an electrically conductive lead wire 421 connects a conductive layer 60a for the ground formed on the mounting substrate 60 with a part of the electrically conductive foil 332 exposed through the opening portion 333a. Note that the electrically conductive lead wire 421 is fixed with an electrically conductive member 422 (e.g., electrically conductive adhesive, solder, or the like).

FIGS. 45 to 48 are cross sectional views for illustrating a manufacturing method of the electronic component module according to the fourth embodiment of the present invention. Next, with reference to FIGS. 17, 18, 37 to 40 and 45 to 48, the manufacturing method of the electronic component module 400 according to the fourth embodiment of the present invention will be described.

First, using the same method as the third embodiment illustrated in FIGS. 37 to 39, the top plate aggregate 330a (see FIG. 39) is formed. In this case, the solder resist is patterned so that the opening portion 333a (see FIG. 40) is formed in a predetermined portion of the insulating layer 333.

Figure 45:
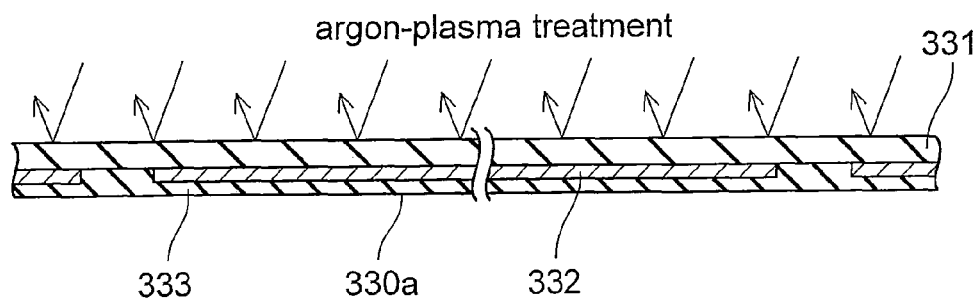
FIG. 45 is a cross sectional view for illustrating a manufacturing method of the electronic component module according to the fourth embodiment of the present invention.
Figure 46:
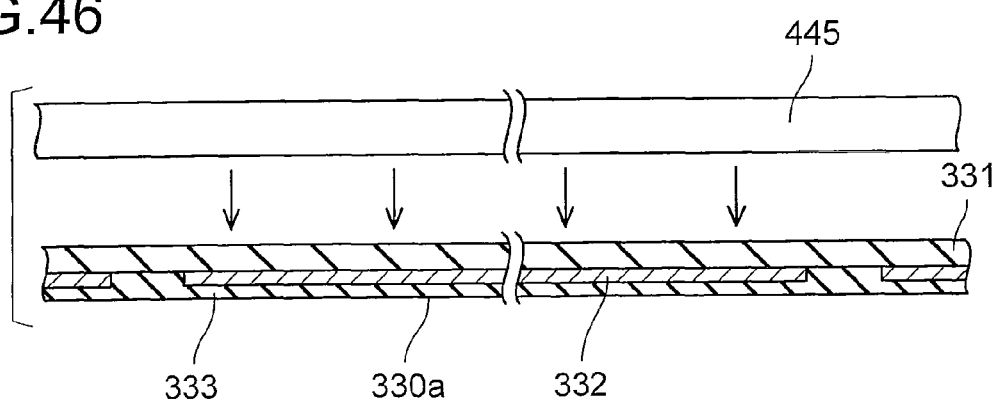
FIG. 46 is a cross sectional view for illustrating the manufacturing method of the electronic component module according to the fourth embodiment of the present invention.
Figure 47:
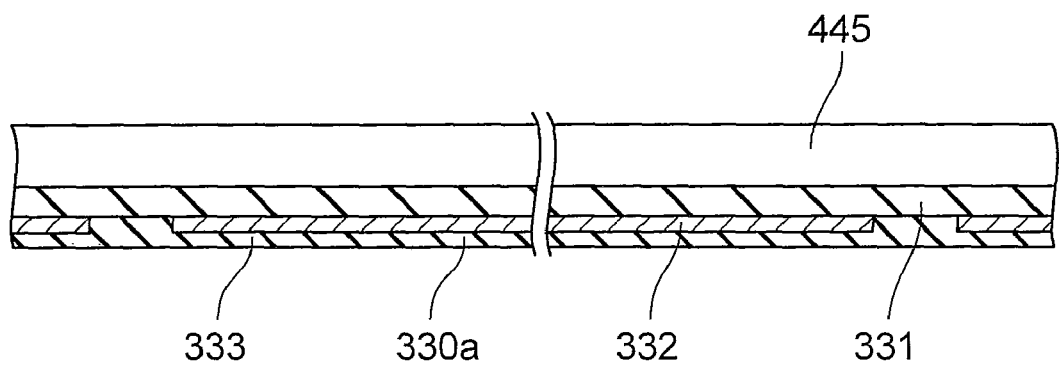
FIG. 47 is a cross sectional view for illustrating the manufacturing method of the electronic component module according to the fourth embodiment of the present invention.

Next, as illustrated in FIG. 45, the other principal surface of the base material portion 331 on the opposite side to the one principal surface is processed with a surface roughing treatment such as the argon plasma treatment, so that the other principal surface of the base material portion 331 has a surface roughness (arithmetic mean surface roughness, Ra) of approximately 400 nm. The arrows in FIG. 45 conceptually show the argon plasma treatment. Then, as illustrated in FIGS. 46 and 47, the sheet-like elastic member 445 (e.g., die bonding sheet) is fixed onto the other principal surface of the base material portion 331 after the surface roughing treatment by a thermally compressing and bonding process. In this way, the top plate aggregate 330a is formed as a plurality of coupled top plates 330. Note that the elastic member 445 is fixed to the top plate aggregate 330a in advance.

Figure 48:
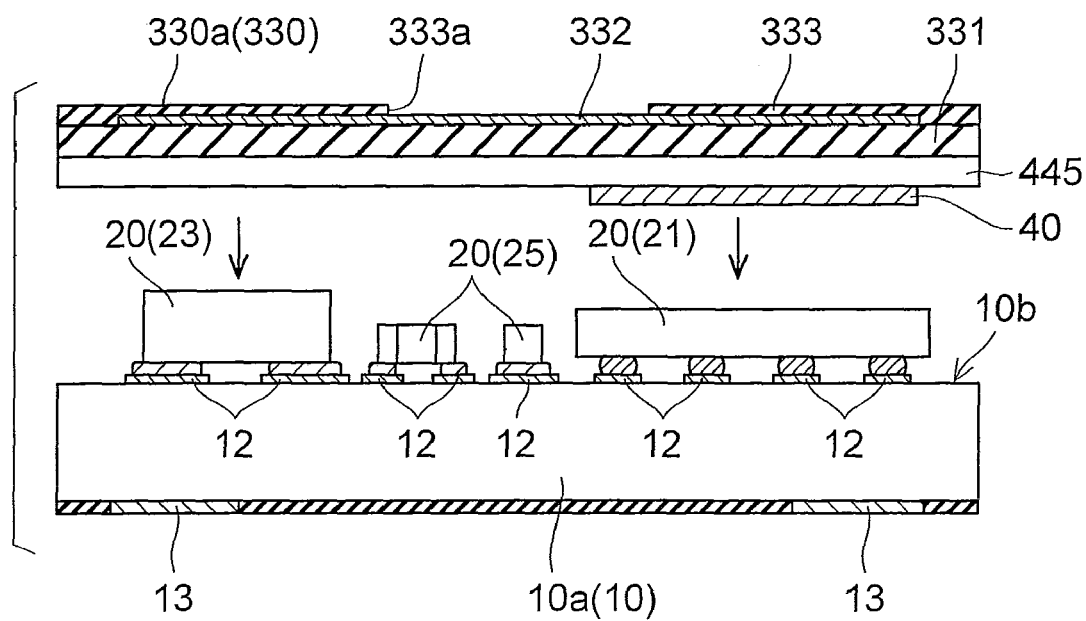
FIG. 48 is a cross sectional view for illustrating the manufacturing method of the electronic component module according to the fourth embodiment of the present invention.

Next, as illustrated in FIG. 48, the top plate holding member 40 is fixed to the top plate aggregate 330a, and then in the same manner as the first and the third embodiment, the top plate aggregate 330a with the top plate holding member 40 is fixed to some of the electronic components 20 mounted in the component mounting region 10b of the substrate aggregate 10a.

After that, using the same method as the first embodiment illustrated in FIGS. 17 and 18, the individual electronic component modules are obtained. In this way, the electronic component module 400 according to the fourth embodiment is manufactured.

(Fifth Embodiment)

Figure 49:
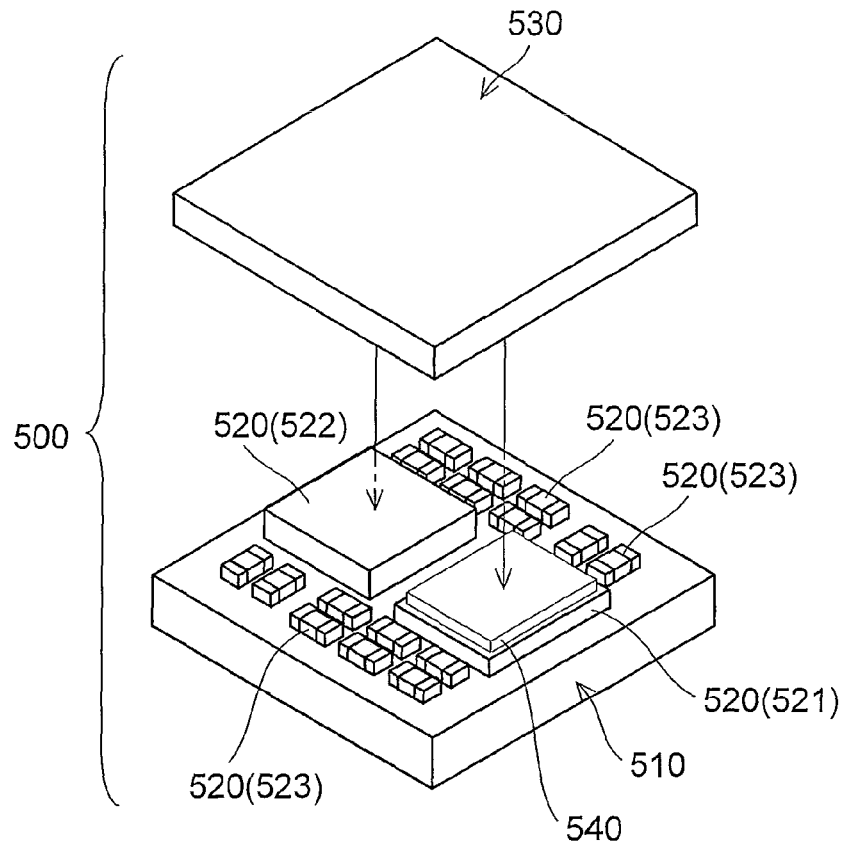
FIG. 49 is an exploded perspective view of the electronic component module according to a fifth embodiment of the present invention.
Figure 50:
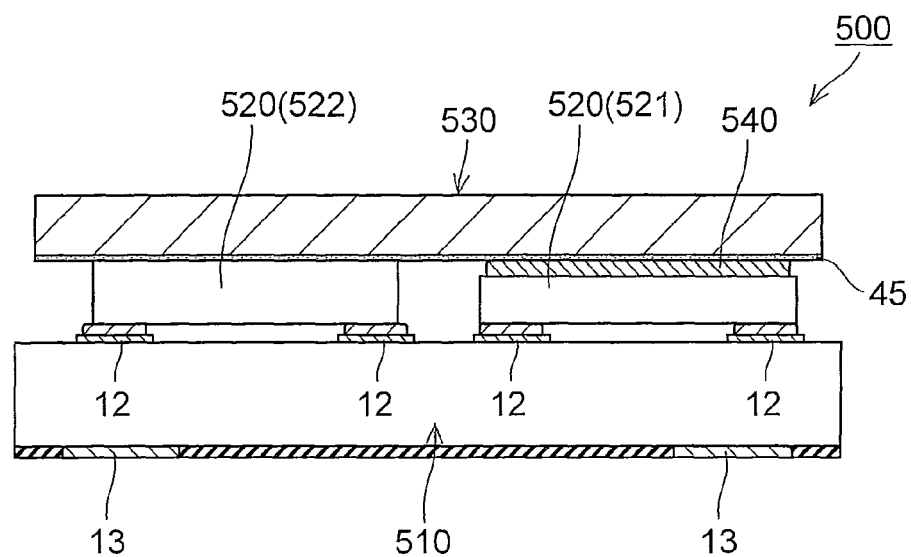
FIG. 50 is a cross sectional view of the electronic component module according to the fifth embodiment of the present invention.
Figure 51:
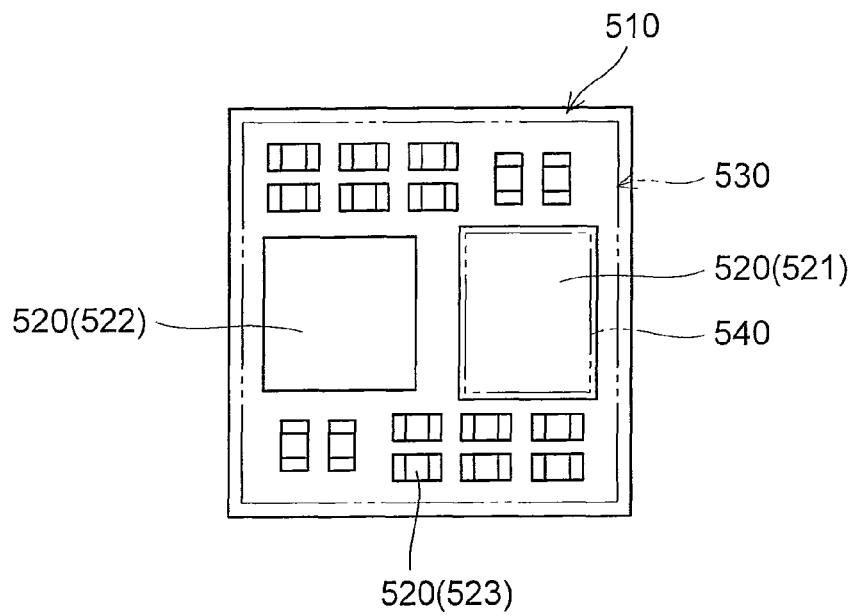
FIG. 51 is a plan view of the electronic component module according to the fifth embodiment of the present invention.

FIG. 49 is an exploded perspective view of the electronic component module according to the fifth embodiment of the present invention. FIG. 50 is a cross sectional view of the electronic component module according to the fifth embodiment of the present invention. FIG. 51 is a plan view of the electronic component module according to the fifth embodiment of the present invention. Note that FIG. 51 illustrates the state where the top plate is removed. Next, with reference to FIGS. 49 to 51, the electronic component module 500 according to the fifth embodiment of the present invention will be described.

The electronic component module 500 according to the fifth embodiment includes, as illustrated in FIGS. 49 and 50, a module substrate 510, a plurality of electronic components 520 mounted on the top surface of the module substrate 510, a planar top plate 530 covering the electronic components 520, and a top plate holding member 540 for holding the top plate 530. Note that the module substrate 510 is an example of the "substrate" in the present invention.

The module substrate 510 constituting the electronic component module 500 is constituted of a ceramic multilayer substrate having a predetermined thickness. In addition, as illustrated in FIGS. 49 and 51, on the top surface of the module substrate 510, there are mounted electronic components 520 such as a heat generating component 521, a semiconductor component 522 including a semiconductor device (IC), and passive components 523 (resistor elements, inductor elements, capacitor elements and the like). In addition, in the fifth embodiment, the semiconductor component 522 is a tall component having the largest height. Note that the semiconductor component 522 is an example of the "first electronic component" in the present invention, and the heat generating component 521 is the "second electronic component" in the present invention.

The heat generating component 521 includes a heat generating element which generates heat when being driven, and is a component which requires heat dissipation for suppressing a thermal influence. Specifically, in the fifth embodiment, a surface acoustic wave (SAW) filter is mounted as the heat generating component 521 on the module substrate 510. This SAW filter includes a piezoelectric substrate (not shown). In addition, the SAW filter generates a loss of a surface acoustic wave (SAW) propagating on the piezoelectric substrate, which increases along with an increase of temperature by approximately 0.02 dB per degrees centigrade. Therefore, in order to control the loss deterioration below 0.1 dB for example, it is necessary to set the increase of temperature below 5 degrees centigrade. In addition, since the SAW filter has a temperature coefficient of 40 ppm per degrees centigrade, if temperature of the SAW filter increases, its frequency characteristic is shifted to low temperature side. Therefore, in order to control the frequency shift below 0.2 MHz, it is necessary to control the increase of temperature below 3 degrees centigrade.

In addition, as illustrated in FIGS. 49 and 50, the top plate 530 is made of metal plate such as copper plate or aluminum plate and is disposed on the top surface side of the module substrate 510 so as to cover the electronic components 520. In addition, the adhesive layer 45 (see FIG. 50) is formed on the back surface of the top plate 530 (surface facing the module substrate 510), and the top plate 530 is fixed to the top surface of the semiconductor component 522 via the adhesive layer 45.

Here, in the fifth embodiment, the top plate holding member 540 is disposed between the heat generating component 521 and the top plate 530 fixed to the semiconductor component 522. This top plate holding member 540 has a thickness that is substantially equal to a height difference between the semiconductor component 522 and the heat generating component 521, so as to compensate for the gap between the top plate 530 and the heat generating component 521. Then, the top plate holding member 540 holds the top plate 530 to be substantially parallel to the module substrate 510. In other words, the top plate holding member 540 fixes the top plate 530 to the module substrate 510 in a stable state.

In addition, in the fifth embodiment, the top plate holding member 540 is made of a thermal conductive material. Specifically, the top plate holding member 540 is made of metal plate such as copper plate or aluminum plate. In addition, the top plate holding member 540 is disposed so as to cover the top surface of the heat generating component 521 as illustrated in FIG. 50.

In the fifth embodiment, as described above, the top plate holding member 540 made of metal plate is disposed between the top plate 530 and the heat generating component 521 so as to cover the top surface of the heat generating component 521, so that heat from the heat generating component 521 can be dissipated through the top plate holding member 540. Therefore, heat dissipation characteristic of the electronic component module 500 can be improved without providing additional heat radiation member or the like. Thus, characteristic deterioration of the heat generating component 521 can be suppressed, so that characteristic of the electronic component module 500 can be improved and reliability can be improved.

In addition, in the fifth embodiment, since the top plate 530 is made of metal plate, heat from the heat generating component 521 can be dissipated not only through the top plate holding member 540 but also through the top plate 530. Thus, the heat dissipation characteristic of the electronic component module 500 can be improved more.

Other effects of the fifth embodiment are the same as those of the first embodiment.

Note that the embodiments disclosed here are examples in every respect and should not be interpreted as a limitation. The scope of the present invention is defined not by the description of the embodiments but by the claims, which further includes every modification in the equivalent meaning and scope of the claims.

For instance, the first to the fifth embodiments describe examples in which the electronic component module is constituted of the module substrate that is a ceramic multilayer substrate, but the present invention is not limited to this structure. It is possible to constitute the electronic component module by using a module substrate other than a ceramic multilayer substrate. For instance, it is possible to use a module substrate constituted of a multilayer resin substrate so as to constitute the electronic component module.

In addition, the first to the fourth embodiments describes examples in which a plurality of electronic components including electronic components for working as a tuner are mounted on the top surface of the module substrate, but a component such as a low pass filter (LPF) or a SAW filter may be mounted on the top surface of the module substrate in addition to the above-mentioned electronic components.

In addition, the first to the fifth embodiments describe examples in which the top plate holding member is disposed between one electronic component and the top plate, but the present invention is not limited to this structure. It is possible to dispose the top plate holding member between the top plate and a plurality of electronic components. For instance, in the first to the fourth embodiments, the top plate holding member may be disposed not only between the RF-IC and the top plate but also between the OFDM demodulation IC and the top plate. In addition, if other electronic component such as a semiconductor device (IC) or a SAW filter is mounted on the module substrate, the holding member may be disposed between the electronic component and the top plate. Note that the same structure may be applied to the fifth embodiment, too.

Figure 52:
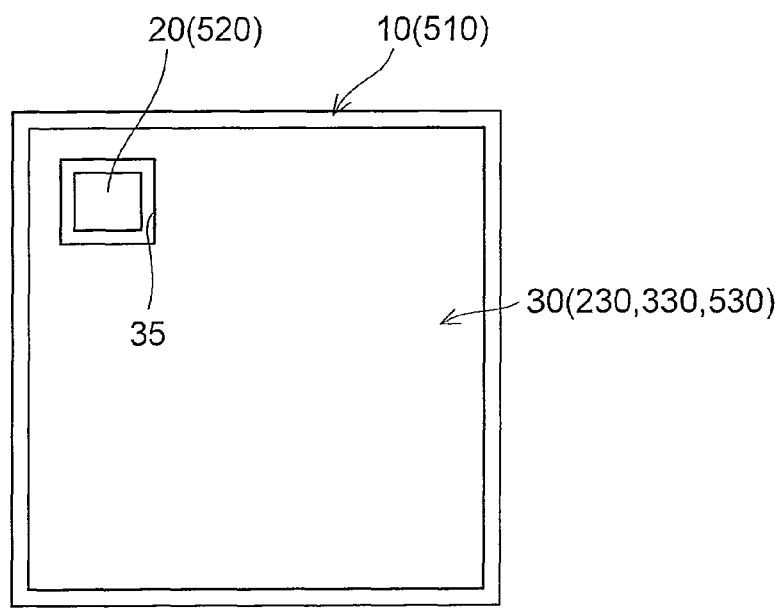
FIG. 52 is a plan view of the electronic component module according to a first variation example of the present invention.
Figure 53:
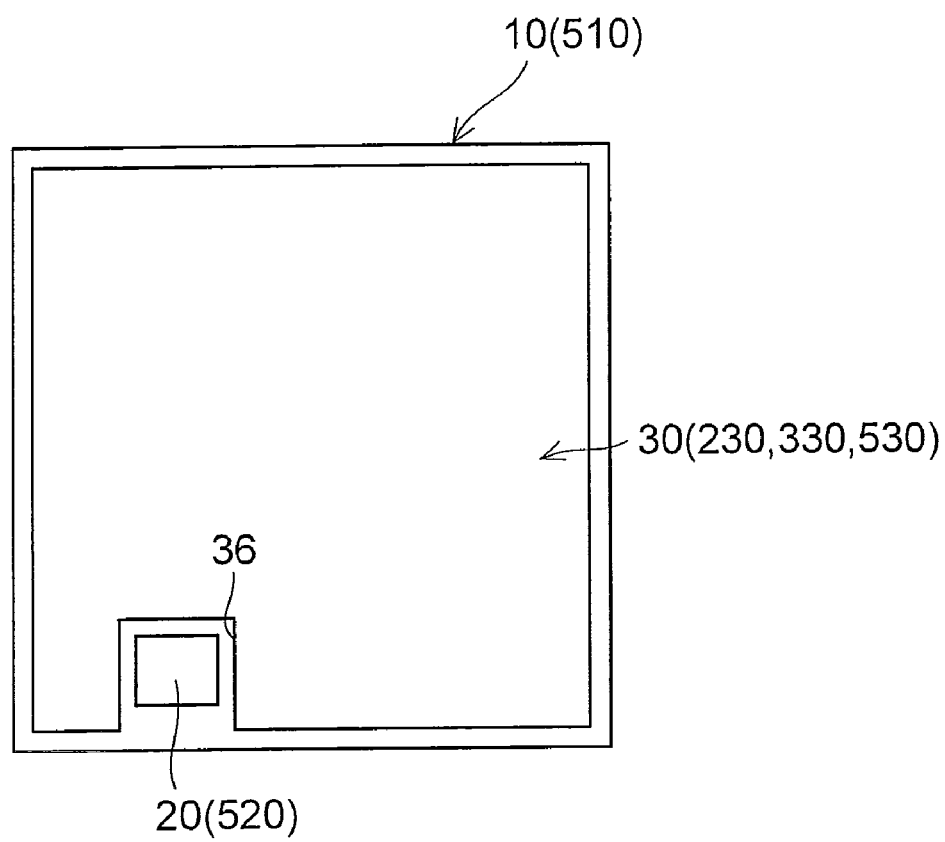
FIG. 53 is a plan view of the electronic component module according to a second variation example of the present invention.

In addition, the first to the fifth embodiments describe examples in which the top plate is fixed to the tall electronic component having the largest height, but the present invention is not limited to this structure. It is possible to fix the top plate to an electronic component other than the tall electronic component having the largest height. In this case, as illustrated in FIG. 52, the top plate 30 (230, 330 or 530) should be constituted to have an opening portion 35 in a part of the top plate 30 (230, 330 or 530) so as to avoid the tall component 20 (520) having the largest height. In addition, as illustrated in FIG. 53, if the tall component 20 (520) having the largest height is mounted at the edge portion on the module substrate 10 (510), it is possible to constitute the top plate 30 (230, 330 or 530) so as to avoid the tall component 20 (520) having the largest height by forming a notch 36 in the top plate 30 (230, 330 or 530).

In addition, in the first to the fifth embodiments, it is preferable that the top plate is made of a material that is related to a characteristic of the electronic component covered with the top plate. For instance, if the electronic components mounted on the module substrate include an electronic component generating an electromagnetic wave of high frequency or the like, it is preferable that the top plate is made of an electromagnetic shield material. In addition, if the electronic components mounted on the module include a heat generating component in addition to the electronic component generating an electromagnetic wave of high frequency or the like, it is preferable that the top plate is made of a material having a shield function and a heat radiation function.

In addition, in the first to the fifth embodiments, when the top plate and the top plate holding member are made of the electromagnetic shield material, an electromagnetic shield material such as magnesium, brass, iron or permalloy (Fe—Ni alloy) may be used instead of copper or aluminum as the electromagnetic shield material.

In addition, the first to the fifth embodiments describe the examples in which the top plate has a flat surface area smaller than that of the module substrate, but the present invention is not limited to this structure. It is possible that the top plate and the module substrate have the same outside dimensions (flat surface shape and flat surface area).

Note that in the first to the fifth embodiments, the shape and the size of the electronic component module, the structure of the circuit, and the like can be modified appropriately.

In addition, the first to the fifth embodiments describe the examples in which the top plate is disposed on the top surface of the module substrate side so as to cover the plurality of electronic components mounted on the module substrate, but the present invention is not limited to this structure. It is possible to adopt a structure in which some of the electronic components mounted on the module substrate are not covered with the top plate.

In addition, in the first to the fifth embodiments, the top plate holding member may be formed by using a plurality of materials. For instance, a multilayer resin substrate in which a metal layer and a resin layer are laminated may be used for forming the top plate holding member.

In addition, in the first to the fifth embodiments, it is preferable that the top plate holding member is made of a material that is related to a characteristic of the electronic component covered with the top plate holding member. For instance, as described in the above-mentioned embodiment, if the electronic component covered with the top plate holding member is an electronic component generating an electromagnetic wave of high frequency or the like, it is preferable that the top plate holding member is made of an electromagnetic shield material. In addition, if the electronic component covered with the top plate holding member is a heat generating component, it is preferable that the top plate holding member is made of a high thermal conductive material.

In addition, in the first to the fifth embodiments, the top plate holding member may cover a part of the top surface of the electronic component or may cover the entire surface of the top surface of the electronic component. Note that in order to hold the top plate stably, it is preferable that the top plate holding member is formed to have an as large flat surface area as possible. Therefore, it is preferable that the top plate holding member is formed to have a flat surface area that is approximately the same as or larger than that of the top surface of the electronic component. In addition, with this structure, it is possible to obtain the shielding effect or the heat radiation effect effectively.

Note that in the first to the fifth embodiments, the top plate holding member may be fixed to the electronic component or may not be fixed to the same. In addition, if the top plate holding member is fixed to the electronic component, the top plate holding member may not be fixed to the top plate.

In addition, the first to the fourth embodiments describe the examples in which the electronic component module is constituted to work as a tuner module (high frequency module), but the present invention is not limited to this structure. It is possible that the electronic component module is constituted to have a function other than the tuner module (high frequency module).

In addition, the first to the fourth embodiments describe the examples in which the top plate is fixed to the quartz resonator as a tall component, but the present invention is not limited to this structure. If a tall component other than the quartz resonator is mounted on the module substrate, the top plate may be fixed to the tall electronic component. For instance, if a tall semiconductor device, a tall SAW filter or the like is mounted on the module substrate, the top plate may be fixed to the electronic component.

In addition, the first to the fourth embodiments describe the examples in which the top plate holding member is disposed between the top plate and the RF-IC, but the present invention is not limited to this structure. The top plate holding member may be disposed between the top plate and the electronic component having a height smaller than that of the electronic component to which the top plate is foxed. Note that it is preferable that the electronic component to which the top plate holding member is disposed is an electronic component having a relatively large flat surface area of the top surface. As such an electronic component, there is, for example, a mount component including the integrated circuit element (IC), a SAW filter or the like.

In addition, the first to the fourth embodiments describe the examples in which the semiconductor device constituted of the WL-CSP (RF-IC, OFDM demodulation IC) is mounted, but the present invention is not limited to this structure. The semiconductor device (IC) mounted on the module substrate may be a form other than the WL-CSP. The form of the semiconductor device (IC) may be, for example, a bare chip or a package form other than the WL-CSP.

In addition, the first, the third, the fourth and the fifth embodiment describe the examples in which the top plate holding member is made of a metal material, but the present invention is not limited to this structure. It is possible that the top plate holding member is made of a material other than a metal material. For instance, the top plate holding member may be made of a resin material.

In addition, if the top plate holding member is made of a metal plate in the second to the fifth embodiments, the variation example of the manufacturing method according to the first embodiment may be used for manufacturing the electronic component module.

In addition, the first embodiment describes the example in which the electronic component module is constituted of the top plate made of resin insulating plate, but the present invention is not limited to this structure. It is possible to use the top plate made of metal plate as described in the second and the fifth embodiments or the top plate having the composite structure as described in the third and the fourth embodiments so as to constitute the electronic component module. In addition, it is possible to use a top plate made of a material other than the above-mentioned material (e.g., ceramic or the like) so as to constitute the electronic component module.

In addition, the second embodiment describes the example in which the top plate holding member is made of a thermosetting resin, but the present invention is not limited to this structure. The top plate holding member may be made of a curable resin other than a thermosetting resin. For instance, the top plate holding member may be made of a photo-curing resin such as ultraviolet-curing resin.

In addition, the second embodiment describes the example in which the liquid-like resin is coated on the top surface of the electronic component so that the top plate holding member made of resin is formed between the top plate and the electronic component (RF-IC), but the present invention is not limited to this structure. For instance, a preformed resin plate may be used as the top plate holding member. In addition, it is possible to form the top plate holding member in a predetermined region on the top plate by printing paste resin in a pattern on one surface of the top plate using a printing method for example, and then curing the resin.

In addition, the second embodiment describes the example in which the top plate holding member is made of resin, but the present invention is not limited to this structure. It is possible that the top plate holding member is made of metal plate (metal material).

In addition, the third and the fourth embodiments describe the examples in which glass epoxy material is used for a base material portion of the top plate, but the present invention is not limited to this structure. The base material portion of the top plate may be made of a material other than glass epoxy material. As the material other than glass epoxy material, there is polyimide film material, for example.

In addition, the third and the fourth embodiments describe the examples in which a thickness of the base material portion of the top plate is approximately 0.1 mm, but the present invention is not limited to this structure. The thickness of the base material portion may be a thickness other than 0.1 mm as long as it has desired flexibility. In addition, the thickness of the electrically conductive foil and the thickness of the insulating layer may be modified appropriately.

In addition, the third and the fourth embodiments describe the examples in which copper foil is used as the electrically conductive foil of the top plate, but the present invention is not limited to this structure. Metal foil other than the copper foil may be used as the electrically conductive foil of the top plate. For instance, aluminum foil or the like may be used as the electrically conductive foil of the top plate.

In addition, the third and the fourth embodiments describe the examples in which the surface roughing treatment of the top plate is performed by the argon plasma treatment, but the present invention is not limited to this structure. A surface roughing treatment method other than the argon-plasma treatment may be used for roughing the surface of the top plate. For instance, a sand blast method (alumina powder spray) or the like may be used for roughing the surface of the top plate. In addition, it is sufficient that the surface roughness of the top plate after the surface roughing treatment is a roughness that enables the top plate to be fixed appropriately to the elastic member, and it may be a roughness other than 400 nm.

In addition, the fourth embodiment describes the example in which die bonding sheet is used as the elastic member, but the present invention is not limited to this structure. A material other than the die bonding sheet (die bonding film) may be used as the elastic member as long as the elastic member has a desired elastic function. For instance, it is possible to form the elastic member on the top plate by printing epoxy paste or the like on the entire surface of the top plate.

In addition, in the first to the third and the fifth embodiments, the surface roughing treatment as described in the fourth embodiment may be performed on one surface of the top plate (the surface on which the adhesive layer is formed). In addition, instead of the adhesive layer, the elastic member as described in the fourth embodiment may be fixed to the top plate.

In addition, the fourth embodiment describes the example in which three mounting examples as mounting examples of the electronic component module, but the present invention is not limited to these examples. It is possible that the electronic component module is mounted in a form other than the three mounting examples described above. Note that if the top plate is made of metal, the electronic component module can be mounted similarly to the three mounting examples described above.

In addition, the fifth embodiment describes the example in which the top plate holding member is made of a metal, but the present invention is not limited to this structure. The top plate holding member may be made of a material other than metal. For instance, the top plate holding member may be made of a resin. In this case, in order to improve heat radiation property, it is preferable that the top plate holding member is made of a high thermal conductive resin. As the high thermal conductive resin, for example, a resin having a thermal conductivity of approximately 2 to 20 W/m·K. In addition, such the high thermal conductive resin can be obtained by making fine powder of a thermal conductive material and mixing the powder as filler into resin as base material.

In addition, the fifth embodiment describes the example in which the top plate is made of metal, but the present invention is not limited to this structure. The top plate may be made of a material other than metal. In this case, considering a heat dissipation characteristic of the module, it is preferable that the top plate is made of a material having a high thermal conductivity (heat dissipation characteristic). For instance, it is preferable that the top plate is made of a ceramic or a high thermal conductive resin.

In addition, the fifth embodiment describes the example in which the SAW filter as the heat generating component is mounted on the module substrate, but the present invention is not limited to this structure. The heat generating component may be an electronic component other than the SAW filter. As a heat generating component other than the SAW filter, there are, for example, a regulator IC, a power amplifier IC, a transistor, a diode, and the like.

In addition, the fifth embodiment describes the example in which the top plate is fixed to the semiconductor component as a tall component, the present invention is not limited to this structure. If a tall component other than the semiconductor component is mounted on the module substrate, the top plate may be fixed to the tall electronic component.

What is claimed is:

1. An electronic component module comprising:
   a first electronic component which is disposed on a top surface of a substrate;
   a second electronic component which has a height lower than that of the first electronic component and is disposed on the top surface of the substrate so as to be side by side with the first electronic component;
   a planar top plate which is fixed to the first electronic component so as to cover the first electronic component and the second electronic component; and
   a top plate holding member which is disposed between the second electronic component and the top plate so as to hold the top plate
   wherein the top plate has a composite structure including an insulating base material portion, and an electrically conductive foil formed on the base material portion,
   wherein the top plate further includes an insulating member which covers the electrically conductive foil,
   wherein the insulating member has an opening portion which exposes a part of the electrically conductive foil, and
   wherein the top plate is adapted so that the opening portion is disposed on the opposite side to the substrate.

2. An electronic component module according to claim 1, wherein a thickness of the top plate holding member is substantially equal to a difference between the height of the first electronic component and the height of the second electronic component.

3. An electronic component module according to claim 1, wherein the second electronic component is a mount component including an integrated circuit element.

4. An electronic component module according to claim 1, wherein the second electronic component is a mount component including a high frequency integrated circuit element, and the top plate holding member is made of an electromagnetic shield material.

5. An electronic component module according to claim 1, wherein the second electronic component is a heat generating component which generates heat by being driven, and the top plate holding member is made of a thermal conductive material.

6. An electronic component module according to claim 1, wherein the top plate holding member is made of a metal material.

7. An electronic component module according to claim 1, wherein the top plate holding member is made of a resin material including a thermal conductive resin or an electrically conductive resin.

8. An electronic component module according to claim 7, wherein the resin material forming the top plate holding member contains a thermosetting resin.

9. An electronic component module according to claim 1, wherein the base material portion of the top plate is made of a glass epoxy material, and the electrically conductive foil of the top plate is made of copper foil.

10. An electronic component module according to claim 1, wherein the electrically conductive foil has a flat surface area smaller than that of the base material portion, and the electrically conductive foil is disposed so that an outer edge of the electrically conductive foil is inside an outer edge of the base material portion in a plan view.

11. An electronic component module according to claim 1, further comprising:
    an elastic member having an elastic function disposed between the top plate and the electronic component,
    wherein the top plate is fixed to the first electronic component via the elastic member.

12. An electronic component module according to claim 11, wherein the elastic member is formed in a sheet-like shape having a predetermined thickness and is fixed to the top plate in advance.

13. An electronic component module according to claim 11, wherein the elastic member is made of an epoxy resin having low elasticity.

14. An electronic component module according to claim 1, wherein the top plate has a flat surface area smaller than that of the substrate, and the top plate is disposed so that an outer edge of the top plate is inside an outer edge of the substrate.

* * * * *